United States Patent
Tanaka

(10) Patent No.: US 11,283,036 B2
(45) Date of Patent: Mar. 22, 2022

(54) ORGANIC ELECTROLUMINESCENT ELEMENT, LIGHTING DEVICE, AND DISPLAY DEVICE

(71) Applicant: XIANYANG CHVT NEW DISPLAY TECHNOLOGY CO., LTD., Xianyang (CN)

(72) Inventor: Junichi Tanaka, Yonezawa (JP)

(73) Assignee: XIANYANG CHVT NEW DISPLAY TECHNOLOGY CO., LTD., Xianyang (CN)

( * ) Notice: Subject to any disclaimer, the term of this patent is extended or adjusted under 35 U.S.C. 154(b) by 387 days.

(21) Appl. No.: 16/469,007

(22) PCT Filed: Dec. 27, 2017

(86) PCT No.: PCT/JP2017/047103
§ 371 (c)(1),
(2) Date: Jun. 12, 2019

(87) PCT Pub. No.: WO2018/124239
PCT Pub. Date: Jul. 5, 2018

(65) Prior Publication Data
US 2019/0363273 A1  Nov. 28, 2019

(30) Foreign Application Priority Data
Dec. 27, 2016 (JP) .............. JP2016-254301

(51) Int. Cl.
*H01L 51/50* (2006.01)
*H01L 51/52* (2006.01)
(Continued)

(52) U.S. Cl.
CPC ........ *H01L 51/5012* (2013.01); *H01L 51/504* (2013.01); *H01L 51/5206* (2013.01);
(Continued)

(58) Field of Classification Search
CPC .............. H01L 51/5012; H01L 51/504; H01L 51/5206; H01L 51/5221; H01L 27/32;
(Continued)

(56) References Cited

U.S. PATENT DOCUMENTS 6,316,786 B1 * 11/2001 Mueller ................ H01L 25/046
257/40
8,963,143 B2  2/2015 Loebl et al.
(Continued)

FOREIGN PATENT DOCUMENTS

JP  2002-164170 A  6/2002
JP  2003-272860 A  9/2003
(Continued)

OTHER PUBLICATIONS

International Search Report issued in PCT/JP2017/047103 (PCT/ISA/210), dated Jan. 10, 2018.

*Primary Examiner* — Donald L Raleigh
(74) *Attorney, Agent, or Firm* — WPAT, PC

(57) ABSTRACT

This organic electroluminescent element comprises a light emission unit between a first electrode and a second electrode, wherein the relational expression nEML>nETL is satisfied in a light emission layer of the light emission unit that is closest to the first electrode, when a maximum emission wavelength ($\lambda_{max}$) is the wavelength at which an emission intensity ($P_{INT}(\lambda)$) that includes spectral luminous efficiency is maximized, said emission intensity ($P_{INT}(\lambda)$) that includes spectral luminous efficiency being calculated from formula (1), nEML is the refractive index of the light emission layer at the maximum emission wavelength ($\lambda$max), and nETL is the refractive index of an electron transport layer. Formula (1): $P_{INT}(\lambda)=P(\lambda)\times V(\lambda)$ (Where $P_{INT}(\lambda)$: emission intensity that includes spectral luminous
(Continued)

efficiency, P(λ): emission intensity, and V(λ): spectral luminous efficiency are all functions of the wavelength λ.)

26 Claims, 15 Drawing Sheets

(51) Int. Cl.
    *H05B 33/04*     (2006.01)
    *G09F 9/30*     (2006.01)
    *H01L 27/32*     (2006.01)
    *H05B 33/06*     (2006.01)

(52) U.S. Cl.
    CPC ......... *H01L 51/5221* (2013.01); *H05B 33/04* (2013.01); *G09F 9/30* (2013.01); *H01L 27/32* (2013.01); *H05B 33/06* (2013.01)

(58) Field of Classification Search
    CPC ..... H01L 51/5265; H05B 33/04; H05B 33/06; H05B 33/02; H05B 33/12; H05B 33/26; G09F 9/30
    See application file for complete search history.

(56) References Cited

U.S. PATENT DOCUMENTS

| | | |
|---|---|---|
| 10,084,146 B2 | 9/2018 | Tanaka et al. |
| 10,217,967 B2 | 2/2019 | Kido et al. |
| 2010/0328928 A1* | 12/2010 | Matsukura .......... H01L 51/5012 362/97.1 |
| 2011/0057221 A1* | 3/2011 | Sonoda ................ H01L 51/5253 257/98 |
| 2011/0248249 A1* | 10/2011 | Forrest ................ H01L 51/5036 257/40 |
| 2012/0181518 A1 | 7/2012 | Ogiwara et al. |
| 2013/0256639 A1* | 10/2013 | Kambe ................ H01L 51/5096 257/40 |
| 2013/0285027 A1* | 10/2013 | Loebl ................... H01L 51/508 257/40 |
| 2014/0091287 A1* | 4/2014 | Sago ..................... H01L 51/001 257/40 |
| 2015/0207091 A1 | 7/2015 | Morimoto et al. |
| 2016/0079479 A1 | 3/2016 | Yamana et al. |
| 2016/0111475 A1* | 4/2016 | Ohara ................. H01L 51/5044 257/40 |
| 2017/0237021 A1 | 8/2017 | Masahiro et al. |
| 2019/0148676 A1 | 5/2019 | Morimoto et al. |

FOREIGN PATENT DOCUMENTS

| | | |
|---|---|---|
| JP | 2006-286616 A | 10/2006 |
| JP | 2007-242927 A | 9/2007 |
| JP | 2012-156499 A | 8/2012 |
| JP | 2014-11208 A | 1/2014 |
| JP | 2014-502041 A | 1/2014 |
| JP | 2016-66596 A | 4/2016 |
| JP | 2016-167441 A | 9/2016 |
| JP | 5991686 B1 | 9/2016 |
| WO | WO 2016/031840 A1 | 3/2016 |

\* cited by examiner

| CATHODE 100nm |
| ELECTRON TRANSPORT LAYER 48nm ETM1:Dopant=50:50 |
| WHITE LIGHT EMITTING LAYER 27nm |
| HOLE TRANSPORT LAYER 66nm |
| ANODE 100nm |

| CATHODE 100nm |
| SECOND ELECTRON TRANSPORT LAYER 38nm ETM2:Dopant=50:50 |
| FIRST ELECTRON TRANSPORT LAYER ETM1 10nm |
| RED LIGHT EMITTING LAYER 30nm |
| HOLE TRANSPORT LAYER 45nm |
| ANODE 100nm |

FIG.18

| |
|---|
| CATHODE 100nm |
| ELECTRON TRANSPORT LAYER 75nm<br>ETM2:Dopant=50:50 |
| RED PHOSPHORESCENT LIGHT EMITTING LAYER 30nm |
| HOLE TRANSPORT LAYER 45nm |
| FIRST CHARGE GENERATING LAYER 11.6nm |
| ELECTRON TRANS PORT LAYER 15nm |
| BLUE FLUORESCENT LIGHT EMITTING LAYER 25nm |
| HOLE TRANSPORT LAYER 30nm |
| SECOND CHARGE GENERATING LAYER 11.6nm |
| ELECTRON TRANSPORT LAYER 5nm |
| GREEN PHOSPHORESCENT LIGHT EMITTING LAYER 35nm |
| HOLE TRANSPORT LAYER 100nm |
| ANODE 100nm |

FIG.19

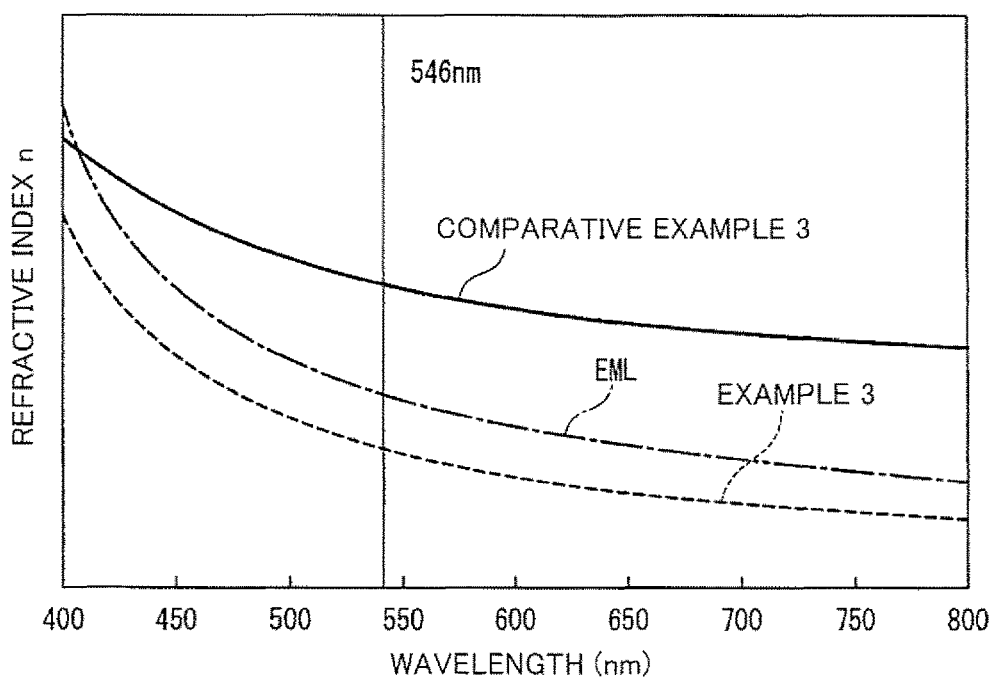

FIG.20

$\lambda_{max}=546nm$

FIG.21

| CATHODE 100nm |
| ELECTRON TRANSPORT LAYER 75nm ETM2:Dopant=100:0 |
| RED PHOSPHORESCENT LIGHT EMITTING LAYER 30nm |
| HOLE TRANSPORT LAYER 45nm |
| FIRST CHARGE GENERATING LAYER 11.6nm |
| ELECTRON TRANSPORT LAYER 15nm |
| BLUE FLUORESCENT LIGHT EMITTING LAYER 25nm |
| HOLE TRANSPORT LAYER 30nm |
| SECOND CHARGE GENERATING LAYER 11.6nm |
| ELECTRON TRANSPORT LAYER 5nm |
| GREEN PHOSPHORESCENT LIGHT EMITTING LAYER 35nm |
| HOLE TRANSPORT LAYER 100nm |
| ANODE 100nm |

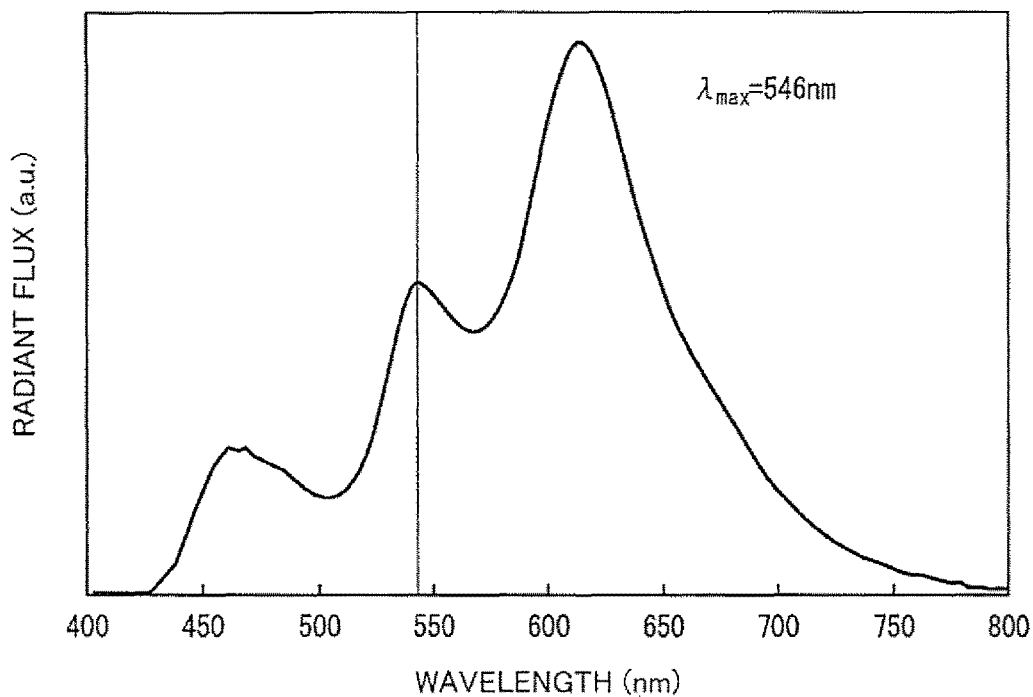

FIG.22

| |
|---|
| CATHODE 150nm |
| ELECTRON TRANSPORT LAYER 45nm<br>ETM2:Dopant=50:50 |
| RED PHOSPHORESCENT LIGHT EMITTING LAYER 30nm |
| HOLE TRANSPORT LAYER 45nm |
| FIRST CHARGE GENERATING LAYER 13.6nm |
| ELECTRON TRANSPORT LAYER 15nm |
| BLUE FLUORESCENT LIGHT EMITTING LAYER 2 25nm |
| HOLE TRANSPORT LAYER 40nm |
| SECOND CHARGE GENERATING LAYER 13.6nm |
| ELECTRON TRANSPORT LAYER 5nm |
| GREEN PHOSPHORESCENT LIGHT EMITTING LAYER 35nm |
| HOLE TRANSPORT LAYER 100nm |
| ANODE 100nm |

FIG.23

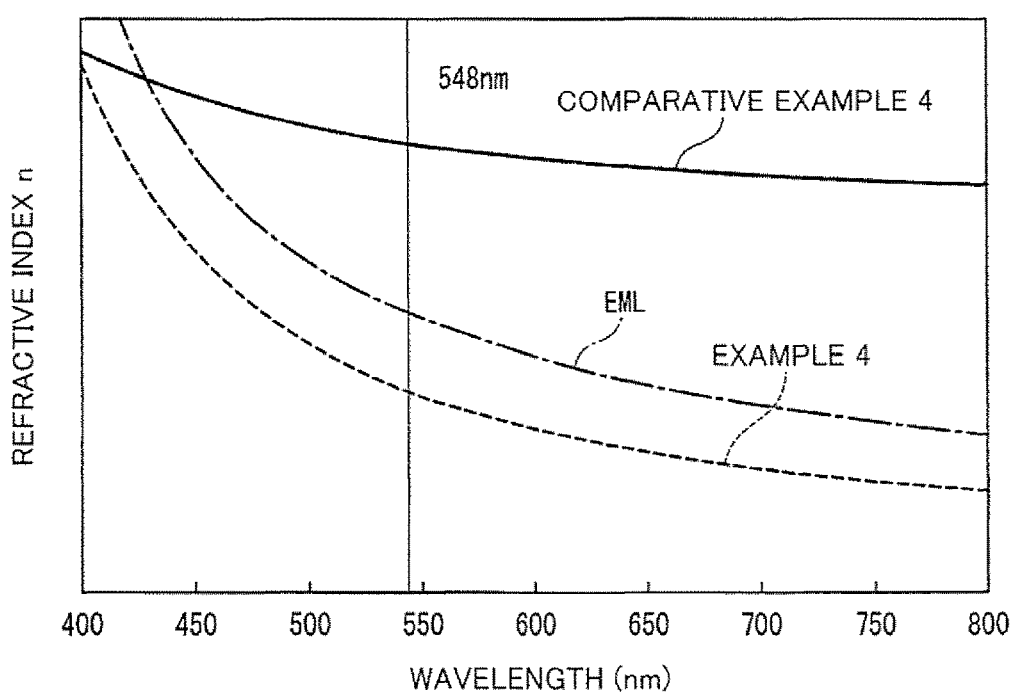

FIG.24

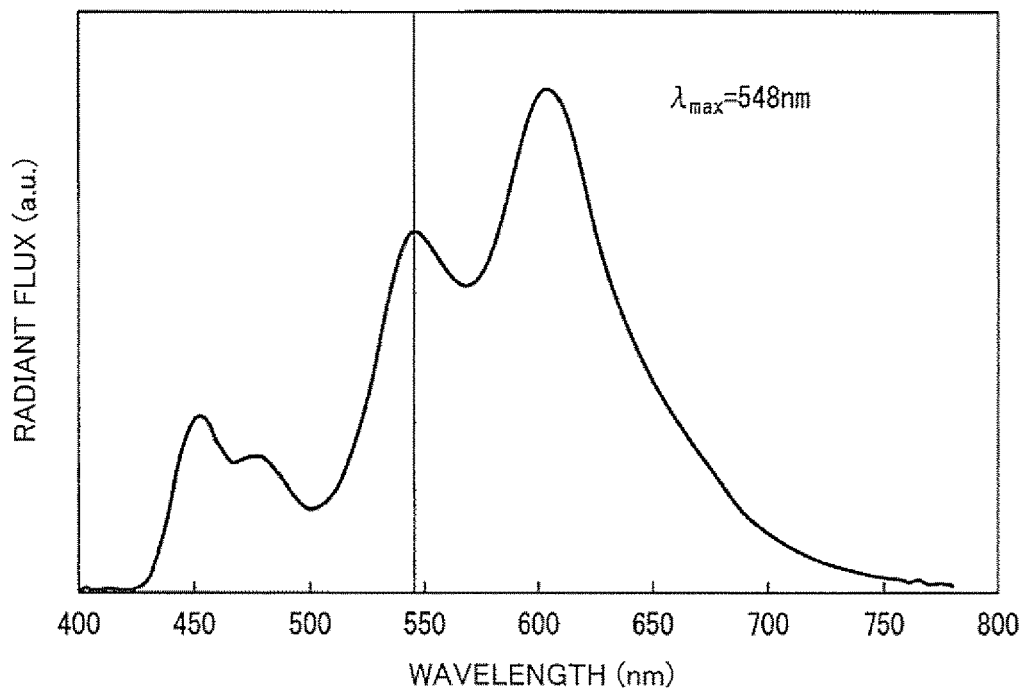

$\lambda_{max}$=548nm

FIG.25

| |
|---|
| CATHODE 150nm |
| ELECTRON TRANSPORT LAYER 45nm<br>ETM1:Dopant=100:0 |
| RED PHOSPHORESCENT LIGHT EMITTING LAYER 30nm |
| HOLE TRANSPORT LAYER 45nm |
| FIRST CHARGE GENERATING LAYER 13.6nm |
| ELECTRON TRANSPORT LAYER 15nm |
| BLUE FLUORESCENT LIGHT EMITTING LAYER 25nm |
| HOLE TRANSPORT LAYER 40nm |
| SECOND CHARGE GENERATING LAYER 13.6nm |
| ELECTRON TRANSPORT LAYER 5nm |
| GREEN PHOSPHORESCENT LIGHT EMITTING LAYER 35nm |
| HOLE TRANSPORT LAYER 100nm |
| ANODE 100nm |

ORGANIC ELECTROLUMINESCENT ELEMENT, LIGHTING DEVICE, AND DISPLAY DEVICE

TECHNICAL FIELD

The present invention relates to an organic electroluminescent element and to a lighting device and a display device including the same.

The present application claims the benefit of priority of Japanese Patent Application No. 2016-254301 filed on Dec. 27, 2016, the contents of which are incorporated herein by reference.

BACKGROUND ART

An organic electroluminescent element (hereafter, also referred to as "organic EL element" for short) is a self-luminescent element including a light emitting layer, made of an organic compound, between a cathode and an anode facing each other. When voltage is applied between the cathode and the anode, electrons injected into the light emitting layer from the cathode side and holes injected into the light emitting layer from the anode side recombine in the light emitting layer to form excitons and the excitons causes the organic EL element to emit light.

As an organic EL element capable of achieving high luminance and long lifetime, there is known an element with a multi-photon emission structure (hereafter, referred to as "MPE element" for short) in which a light emitting unit including at least one light emitting layer is considered as one unit and an electrically-insulating charge generating layer is arranged between multiple light emitting units (for example, see Patent Document 1). In the MPE element, when voltage is applied between a cathode and an anode, charges in a charge transfer complex move to the cathode side and the anode side. In the MPE element, holes are thereby injected into one light emitting unit located on the cathode side of the charge generating layer and electrons are injected into another light emitting unit located on the anode side of the charge generating layer. In such an MPE element, since light can be simultaneously emitted from the multiple light emitting units with the same current amount, a current efficiency and an external quantum efficiency multiplied by the number of the light emitting units can be achieved.

However, in the MPE element, the refractive index of a light transmitting electrode arranged on the light extraction side is about 0.4 to 0.5 higher than the refractive index of a glass substrate. Accordingly, most of light generated in the MPE element is trapped inside the element due to total reflection and sufficient extraction of the light to the outside is difficult. Moreover, in a light reflecting electrode arranged on the opposite side to the light extraction side, the light generated in the MPE element resonates with surface free electrons of metal forming the light reflecting electrode and part of the energy of the light is lost (plasmon loss). Thus, the amount of light which can be extracted to the outside decreases. Since there are such negative factors, the current efficiency and the external quantum efficiency of the MPE element have not reached favorable levels yet.

These are problems which apply to all organic EL elements. As an organic EL element for solving such problems, there is known an organic EL element in which multiple function layers are inserted between the glass substrate and the light transmitting electrode arranged on the light extraction side to reduce the difference in the refractive index between the glass substrate and the light transmitting electrode and improve the light extraction efficiency to the outside (see, for example, Patent Document 2). Moreover, there is known an organic EL element in which multiple electron transport layers with low refractive indices are arranged at positions adjacent to the light reflecting electrode to avoid the plasmon loss and improve the light extraction efficiency to the outside (see, for example, Patent Document 3).

However, in the organic EL elements of Patent Documents 2 and 3, multiple function layers with different properties need to be added. Accordingly, optimization of the performance of the organic EL element and adjustment of manufacturing processes and the like are complex. Thus, these techniques are difficult to apply to a mass-production process and lead to an increase in the manufacturing cost. Moreover, the organic EL elements of Patent Documents 2 and 3 have been made to improve only the light extraction efficiency of a single unit element formed of one light emitting unit and a preferable approach technique which can sufficiently improve the light extraction efficiency of an MPE element including multiple light emitting units has not been established yet.

PRIOR ART DOCUMENT

Patent Document

Patent Document 1: Japanese Patent Application Publication No. 2003-272860
Patent Document 2: Japanese Patent Application Publication No. 2006-286616
Patent Document 3: Published Japanese Translation of PCT International Application No. 2014-502041

SUMMARY OF THE INVENTION

Problems to be Solved by the Invention

The present invention has been made in view of the aforementioned circumstances and an object thereof is to provide an organic electroluminescent element which has a simple function structure suitable for a mass-production process and which has an improved light extraction efficiency in general and to provide a lighting device and a display device including the same.

Means for Solving the Problems

To achieve the above object, provided are the following aspects.

(1) An organic electroluminescent element characterized in that the organic electroluminescent element comprises at least one light emitting unit between a first electrode having a light reflecting property and a second electrode having a light transmitting property, the light emitting unit including an electron transport layer and a light emitting layer made of at least an organic compound, and in the light emitting layer of the light emitting unit closest to the first electrode, a relationship of nEML>nETL is satisfied, where nEML is a refractive index of the light emitting layer at a maximum light emission wavelength ($\lambda_{max}$) and nETL is a refractive index of the electron transport layer at the maximum light emission wavelength ($\lambda_{max}$), the maximum light emission wavelength ($\lambda_{max}$) being a wavelength at which a light emission intensity ($P_{INT}(\lambda)$) taking into consideration a spectral luminous efficiency calculated by formula (1) is maximum, $$P_{INT}(\lambda)=P(\lambda)\times V(\lambda) \tag{1}$$

(where $P_{INT}(\lambda)$ is the light emission intensity taking into consideration the spectral luminous efficiency, $P(\lambda)$ is a light emission intensity, and $V(\lambda)$ is the spectral luminous efficiency, $P_{INT}(\lambda)$, $P(\lambda)$, and $V(\lambda)$ are all functions of wavelength $\lambda$).

(2) The organic electroluminescent element according to the above aspect (1), characterized in that the light emitting layer of the light emitting unit closest to the first electrode includes a first light emitting portion which emits red light, a second light emitting portion which emits green light, and a third light emitting portion which emits blue light.

(3) The organic electroluminescent element according to the above aspect (1), characterized in that the light emitting layer of the light emitting unit closest to the first electrode includes a first light emitting portion which emits red light, a second light emitting portion which emits green light, a third light emitting portion which emits blue light, and a fourth light emitting portion which emits white light.

(4) The organic electroluminescent element according to any one of the above aspects (1) to (3), characterized in that a difference between the refractive index nEML and the refractive index nETL (nEML−nETL) is 0.01 to 0.10.

(5) The organic electroluminescent element according to any one of the above aspects (1) to (4), characterized in that the electron transport layer contains a quinolinol complex containing lithium or calcium.

(6) The organic electroluminescent element according to any one of the above aspects (1) to (5), characterized in that a content of the quinolinol complex containing lithium or calcium in the electron transport layer is 25% by mass or more.

(7) The organic electroluminescent element according to the above aspect (6), characterized in that the content of the quinolinol complex containing lithium or calcium is 50% by mass or more.

(8) The organic electroluminescent element according to any one of the above aspects (1) to (7), characterized in that the electron transport layer includes a first electron transport layer provided adjacent to the light emitting layer and a second electron transport layer provided adjacent to the first electron transport layer, opposite to the light emitting layer, and relationships of nEML<nETL1 and nETL1>nETL2 are satisfied, where nEML is the refractive index of the light emitting layer at the maximum light emission wavelength ($\lambda_{max}$) calculated by formula (1), nETL1 is a refractive index of the first electron transport layer at the maximum light emission wavelength ($\lambda_{max}$), and nETL2 is a refractive index of the second electron transport layer at the maximum light emission wavelength ($\lambda_{max}$).

(9) The organic electroluminescent element according to any one of the above aspects (1) to (8), characterized in that the organic electroluminescent element comprises a plurality of the light emitting units and has a structure in which the plurality of light emitting units are stacked one on top of another with a charge generating layer sandwiched between each pair of the adjacent light emitting units.

(10) The organic electroluminescent element according to the above aspect (9), the organic electroluminescent element capable of providing white light by causing the plurality of light emitting units to emit light, characterized in that the organic electroluminescent element comprises:

a first light emitting unit which emits red phosphorescent light;

a second light emitting unit which emits blue fluorescent light; and a third light emitting unit which emits green phosphorescent light, the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, and the organic electroluminescent element has a structure in which the second electrode, the third light emitting unit, the second charge generating layer, the second light emitting unit, the first charge generating layer, the first light emitting unit, and the first electrode are stacked one on top of another in this order.

(11) The organic electroluminescent element according to the above aspect (9), the organic electroluminescent element capable of providing white light by causing the plurality of light emitting units to emit light, characterized in that the organic electroluminescent element comprises:

a first light emitting unit which emits red phosphorescent light and green phosphorescent light;

a second light emitting unit which emits blue fluorescent light; and a third light emitting unit which emits blue fluorescent light, the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, and the organic electroluminescent element has a structure in which the second electrode, the third light emitting unit, the second charge generating layer, the second light emitting unit, the first charge generating layer, the first light emitting unit, and the first electrode are stacked one on top of another in this order.

(12) The organic electroluminescent element according to the above aspect (9), the organic electroluminescent element capable of providing white light by causing the plurality of light emitting units to emit light, characterized in that the organic electroluminescent element comprises:

a first light emitting unit which emits blue fluorescent light;

a second light emitting unit which emits red phosphorescent light and green phosphorescent light; and a third light emitting unit which emits blue fluorescent light, the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, and the organic electroluminescent element has a structure in which the second electrode, the third light emitting unit, the second charge generating layer, the second light emitting unit, the first charge generating layer, the first light emitting unit, and the first electrode are stacked one on top of another in this order.

(13) The organic electroluminescent element according to the above aspect (9), the organic electroluminescent element capable of providing white light by causing the plurality of light emitting units to emit light, characterized in that
the organic electroluminescent element comprises:
a first light emitting unit which emits red phosphorescent light and green phosphorescent light;
a second light emitting unit which emits blue fluorescent light; and
a third light emitting unit which emits red phosphorescent light and green phosphorescent light,
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent element has a structure in which the second electrode, the third light emitting unit, the second charge generating layer, the second light emitting unit, the first charge generating layer, the first light emitting unit, and the first electrode are stacked one on top of another in this order.

(14) The organic electroluminescent element according to any one of the above aspects (10) to (13), characterized in that the first charge generating layer and the second charge generating layer are formed of electrically insulating layers made of an electron accepting material and an electron donating material, and
a specific resistance of the electrically insulating layers is $1.0 \times 10^2$ Ω·cm or more.

(15) The organic electroluminescent element according to the above aspect (14), characterized in that the specific resistance of the electrically insulating layers is $1.0 \times 10^5$ Ω·cm or more.

(16) The organic electroluminescent element according to any one of the above aspects (10) to (13), characterized in that
each of the first charge generating layer and the second charge generating layer is formed of a mixed layer of different materials and one component of the mixed layer forms a charge transfer complex by redox, and
when voltage is applied between the first electrode and the second electrode, charges in the charge transfer complex move toward the first electrode and the second electrode to cause holes to be injected into the second light emitting unit located on the first electrode side of the second charge generating layer and into the first light emitting unit located on the first electrode side of the first charge generating layer and cause electrons to be injected into the third light emitting unit located on the second electrode side of the second charge generating layer and into the second light emitting unit located on the second electrode side of the first charge generating layer.

(17) The organic electroluminescent element according to any one of the above aspects (10) to (13), characterized in that
each of the first charge generating layer and the second charge generating layer is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move toward the first electrode and the second electrode to cause holes to be injected into the second light emitting unit located on the first electrode side of the second charge generating layer and into the first light emitting unit located on the first electrode side of the first charge generating layer and cause electrons to be injected into the third light emitting unit located on the second electrode side of the second charge generating layer and into the second light emitting unit located on the second electrode side of the first charge generating layer.

(18) The organic electroluminescent element according to any one of the above aspects (10) to (17), characterized in that the first charge generating layer or the second charge generating layer contains a compound having a structure expressed by formula (1):

[Chem. 1]

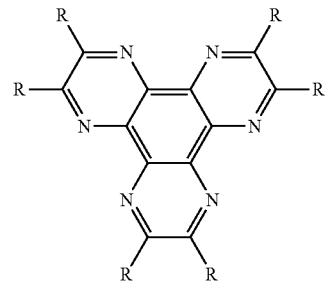

where R represents an electron withdrawing group of F, Cl, Br, I, CN, or $CF_3$.

(19) The organic electroluminescent element according to the above aspect (9), the organic electroluminescent element capable of providing white light by causing the plurality of light emitting units to emit light, characterized in that
the organic electroluminescent element comprises:
a first light emitting unit which emits red phosphorescent light and green phosphorescent light; and
a second light emitting unit which emits blue fluorescent light,
the first light emitting unit and the second light emitting unit are stacked one on top of the other with a first charge generating layer sandwiched therebetween, and
the organic electroluminescent element has a structure in which the second electrode, the second light emitting unit, the first charge generating layer, the first light emitting unit, and the first electrode are stacked one on top of another in this order.

(20) The organic electroluminescent element according to the above aspect (9), the organic electroluminescent element capable of providing white light by causing the plurality of light emitting units to emit light, characterized in that
the organic electroluminescent element comprises:
a first light emitting unit which emits blue fluorescent light; and
a second light emitting unit which emits red phosphorescent light and green phosphorescent light,
the first light emitting unit and the second light emitting unit are stacked one on top of the other with a first charge generating layer sandwiched therebetween,
the organic electroluminescent element has a structure in which the second electrode, the second light emitting unit, the first charge generating layer, the first light emitting unit, and the first electrode are stacked one on top of another in this order.

(21) The organic electroluminescent element according to the above aspect (19) or (20), characterized in that the first charge generating layer is formed of an electrically insulating layer made of an electron accepting material and an electron donating material, and a specific resistance of the electrically insulating layer is $1.0 \times 10^2$ Ω·cm or more.

(22) The organic electroluminescent element according to the above aspect (21), characterized in that the specific resistance of the electrically insulating layer is $1.0 \times 10^5$ Ω·cm or more.

(23) The organic electroluminescent element according to the above aspect (19) or (20), characterized in that the first charge generating layer is formed of a mixed layer of different materials, one component of the mixed layer is a metal oxide, and the metal oxide forms a charge transfer complex by redox, and when voltage is applied between the first electrode and the second electrode, charges in the charge transfer complex move toward the first electrode to cause holes to be injected into the first light emitting unit located on the first electrode side of the first charge generating layer and cause electrons to be injected into the second light emitting unit located on the second electrode side of the first charge generating layer.

(24) The organic electroluminescent element according to the above aspect (19) or (20), characterized in that the first charge generating layer is formed of a laminate of an electron accepting material and an electron donating material, and when voltage is applied between the first electrode and the second electrode, in an interface between the electron accepting material and the electron donating material, charges generated by reaction involving electron transfer between the electron accepting material and the electron donating material move toward the first electrode and the second electrode to cause holes to be injected into the first light emitting unit located on the first electrode side of the first charge generating layer and cause electrons to be injected into the second light emitting unit located on the second electrode side of the first charge generating layer.

(25) The organic electroluminescent element according to any one of the above aspects (19) to (24), characterized in that the first charge generating layer contains a compound having a structure expressed by formula (1):

[Chem. 2]

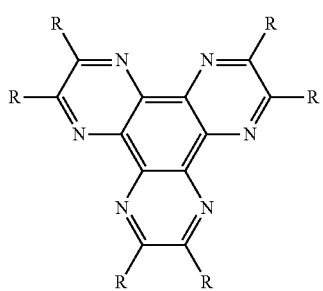

(1)

where R represents an electron withdrawing group of F, Cl, Br, I, CN, or $CF_3$.

(26) The organic electroluminescent element according to any one of the above aspects (1) to (25), characterized in that the first electrode is made of silver.

(27) Alighting device characterized in that the lighting device comprises the organic electroluminescent element according to any one of the above aspects (1) to (26).

(28) The lighting device according to the above aspect (27), characterized in that the lighting device comprises a base substrate and a sealing substrate which are formed of flexible substrates, and the lighting device is flexible.

(29) A display device characterized in that the display device comprises the organic electroluminescent element according to any one of the above aspects (1) to 26.

(30) The display device according to the above aspect (29), characterized in that the display device comprises a base substrate and a sealing substrate which are formed of flexible substrates, and the display device is flexible.

Effect of the Invention

According to the one aspect described above, it is possible to provide an organic electroluminescent element having an improved extraction efficiency of light generated in a light emitting layer and to provide a lighting device and a display device including the same.

BRIEF DESCRIPTION OF THE DRAWINGS

FIG. 18 is a schematic view illustrating an element structure of an organic EL element in Example 3.

FIG. 19 is a graph illustrating measurement results of the refractive indices of light emitting layers and electron transport layers in the organic EL elements in Example 3 and Comparative Example 3.

FIG. 20 is a graph illustrating results of measuring the emission spectrum of the organic EL element in Example 3.

FIG. 21 is a schematic view illustrating an element structure of an organic EL element in Comparative Example 3.

FIG. 22 is a schematic view illustrating an element structure of an organic EL element in Example 4.

FIG. 23 is a graph illustrating measurement results of the refractive indices of light emitting layers and electron transport layers in the organic EL elements in Example 4 and Comparative Example 4.

FIG. 24 is a graph illustrating results obtained by measuring the emission spectrum of the organic EL element in Example 4.

FIG. 25 is a schematic view illustrating an element structure of an organic EL element in Comparative Example 4.

MODE FOR CARRYING OUT THE INVENTION

Figure 1:
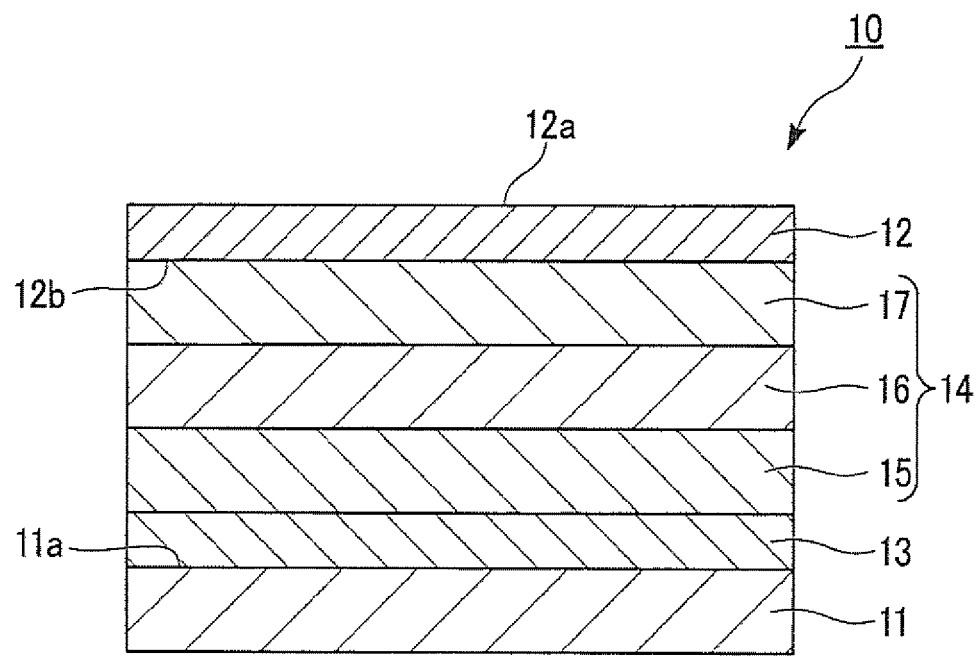
FIG. 1 is a cross-sectional view illustrating a schematic configuration example of a first embodiment of an organic EL element in the present invention.

Embodiments of an organic electroluminescent element of the present invention and a lighting device and a display device including the same are described.

Note that the embodiments are specifically described for better understanding of the spirit of the present invention and do not limit the present invention unless otherwise specified.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

Organic EL Element

First Embodiment

A first embodiment of the organic EL element of the present invention is described. FIG. 1 is a cross-sectional view illustrating a schematic configuration of the first embodiment of the organic EL element in the present invention.

As illustrated in FIG. 1, the organic EL element 10 of the embodiment includes a light emitting unit 14 between a first electrode 12 and a second electrode 13, on one surface 11a of a substrate 11. Specifically, the organic EL element 10 has a laminate structure in which the second electrode 13, a hole transport layer 15, a light emitting layer 16, an electron transport layer 17, and the first electrode 12 are stacked one on top of another in this order on the one surface 11a of the substrate 11.

The light emitting unit 14 is formed of the hole transport layer 15, the light emitting layer 16, and the electron transport layer 17.

The first electrode 12 is a cathode of the organic EL element 10. Generally, a metal with a small work function, an alloy of such a metal, a metal oxide, or the like is preferably used for the first electrode 12. For example, it is possible to use a metal single substance like an alkaline metal such as lithium (Li), an alkaline earth metal such as magnesium (Mg) or calcium (Ca), or a rare-earth metal such as europium (Eu) or use an alloy containing any of these metals and aluminum (Al), silver (Ag), indium (In), or the like.

Alternatively, the first electrode 12 may have a configuration in which an organic layer doped with a metal is provided in an interface between the first electrode 12 and the light emitting unit 14 as described in, for example, "Japanese Patent Application Publication No. Hei 10-270171" and "Japanese Patent Application Publication No. 2001-102175." In this case, it is only necessary to use an electrically conductive material for the first electrode 12 and the material is not limited to one with particular properties such as the work function.

As another alternative, the configuration may be such that an organic layer in contact with the first electrode 12 is made of an organic metal complex compound containing at least one of alkali metal ions, alkaline earth metal ions, and rare-earth metal ions as described in, for example, "Japanese Patent Application Publication No. Hei 11-233262" and "Japanese Patent Application Publication No. 2000-182774." In this case, a metal capable of reducing the metal ions contained in the organic metal complex compound to metal in vacuum, for example, a metal (with a thermal reduction property) such as aluminum (Al), zirconium (Zr), titanium (Ti), and silicon (Si) or an alloy containing any of these metals can be used for the first electrode 12. Among these, Al which is generally widely used as a wiring electrode is particularly preferable from the viewpoint of ease of vapor deposition, high light reflectance, chemical stability, and the like.

The second electrode 13 is an anode of the organic EL element 10. The material of the second electrode 13 is not limited to a particular material. When light is to be extracted from the second electrode 13 side, a transparent, electrically conductive material such as, for example, ITO (Indium Tin Oxide) or IZO (Indium Zinc Oxide) can be used.

Moreover, for the second electrode 13, for example, the method described in "Japanese Patent Application Publication No. 2002-332567" is employed to form an ITO film by sputtering which does not damage an organic film. In this case, the aforementioned transparent, electrically conductive material such as ITO and IZO can be used for the first electrode 12 by using an organic layer doped with metal disclosed in, for example, "Japanese Patent Application Publication No. Hei 10-270171" as an electron injection layer.

Moreover, in contrary to a general organic EL element, light can be extracted from the first electrode 12 side by using a metal material for the second electrode 13 and using a transparent, electrically conductive material for the first electrode 12. Furthermore, the order of film formation does not have to start from the second electrode 13 side and may start from the first electrode 12 side.

The light emitting unit 14 may employ any of various structures similar to those of conventionally-known organic EL elements and may have any laminated structure as long as it includes a light emitting layer made of at least an organic compound. For example, an electron injection layer, a hole blocking layer, and the like may be arranged on the first electrode 12 side of the light emitting layer 16. Moreover, a hole injection layer, an electron blocking layer, and the like may be arranged on the second electrode 13 side of the light emitting layer 16.

Specifically, in the embodiment, the light emitting unit 14 has a structure in which the electron transport layer 17 and the light emitting layer 16 are stacked one on top of the other in this order from the first electrode 12 side between the first electrode 12 and the hole transport layer 15.

The light emitting layer 16 includes at least one light emitting portion selected from the group consisting of a red light emitting portion which emits red light, a green light emitting portion which emits green light, a blue light emitting portion which emits blue light, and a white light emitting portion which emits white light.

FIG. 1 illustrates an example in which the light emitting layer 16 includes one light emitting portion selected from the group consisting of the red light emitting portion which emits the red light, the green light emitting portion which emits the green light, the blue light emitting portion which emits the blue light, and the white light emitting portion which emits the white light.

Each of the light emitting portions forming the light emitting layer 16 generally contains a host material which is a main component and a guest material which is a minor component as the organic compound. Emission of each of the red light, the green light, the blue light, and the white light is attributable particularly to the properties of the guest material.

The guest material is also referred to as dopant material. The guest material utilizing fluorescent light emission is generally referred to as fluorescent light emitting material and a light emitting layer made of the fluorescent light emitting material is referred to as fluorescent light emitting layer. Meanwhile, the guest material utilizing phosphorescent light emission is generally referred to as phosphorescent light emitting material and a light emitting layer made of the phosphorescent light emitting material is referred to as phosphorescent light emitting layer.

In the phosphorescent light emitting layer out of these layers, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

The guest material of the phosphorescent light emitting layer is not limited to a particular material. For example, in a red phosphorescent light emitting layer, a red phosphorescent light emitting material such as $Ir(piq)_3$ and $Ir(btpy)_3$ can be used. Meanwhile, in a green phosphorescent light emitting layer, a green phosphorescent light emitting material such as $Ir\ (ppy)_3$ can be used. Moreover, in a blue phosphorescent light emitting layer, a blue phosphorescent light emitting material such as $Ir(Fppy)_3$ can be used. Meanwhile, in a white light emitting layer, the red phosphorescent light emitting material, the green phosphorescent light emitting material, and the blue phosphorescent light emitting material are mixed at an appropriate ratio with the host material described in [0026]. This enables emission of light of mixed colors and the white light can be thereby emitted.

As the host material of the phosphorescent light emitting layers, a material with an electron transport property, a material with a hole transport property, a material obtained by mixing these materials, or the like can be used. Specifically, for example, 4,4'-biscarbazolylbiphenyl (CBP), 2,9-dimethyl-4,7-diphenyl-9,10-phenanthroline (BCP), or the like can be used.

In the embodiment, from the viewpoint of improving the lifetime of the element and achieving an excellent color rendering property, it is preferable to use the blue fluorescent light emitting material as the guest material of the blue light emitting layer. For example, the blue fluorescent light emitting materials described in paragraphs [0052] to [0061] of "International Patent Application Publication No. WO2012/053216" can be used as the host material and the guest material of the blue fluorescent light emitting layer. Moreover, as the guest material, for example, a styrylamine compound, a fluoranthene compound, an aminopyrene compound, a boron complex, or the like can be used. Moreover, the light emitted from the light emitting unit including the blue fluorescent light emitting layer preferably includes a delayed fluorescence component.

The electron transport layer (ELT) 17 is made of, for example, a conventionally well-known electron transport material but is not limited to a particular material. As the electron transport material forming the electron transport layer 17, an electron transport material with a relatively deep HOMO (Highest Occupied Molecular Orbital) level is preferably used among electron transport materials generally used for organic EL elements. Specifically, an electron transport material with a HOMO level of at least about 6.0 eV is preferably used.

The electron transport layer 17 preferably contains a quinolinol complex containing lithium (Li) or calcium (Ca).

Figure 9:
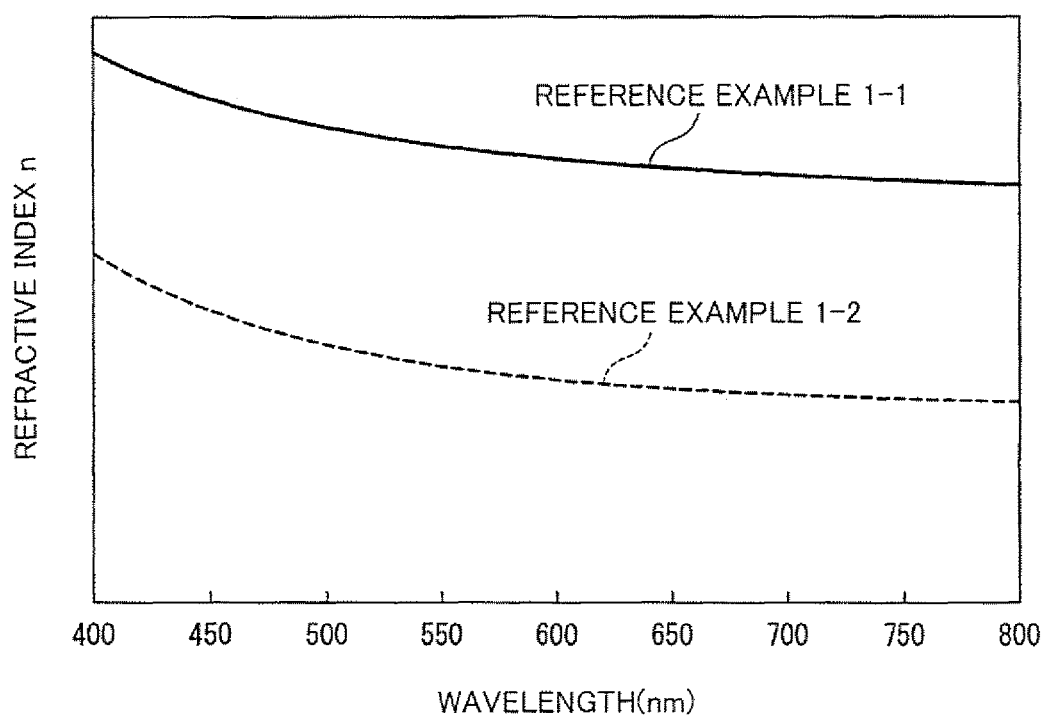
FIG. 9 is a graph illustrating results of measuring the refractive index of a thin film made only of an electron transport material and the refractive index of a thin film containing the electron transport material and a quinolinol complex containing Li in Reference Example 1.
Figures 10, 11:
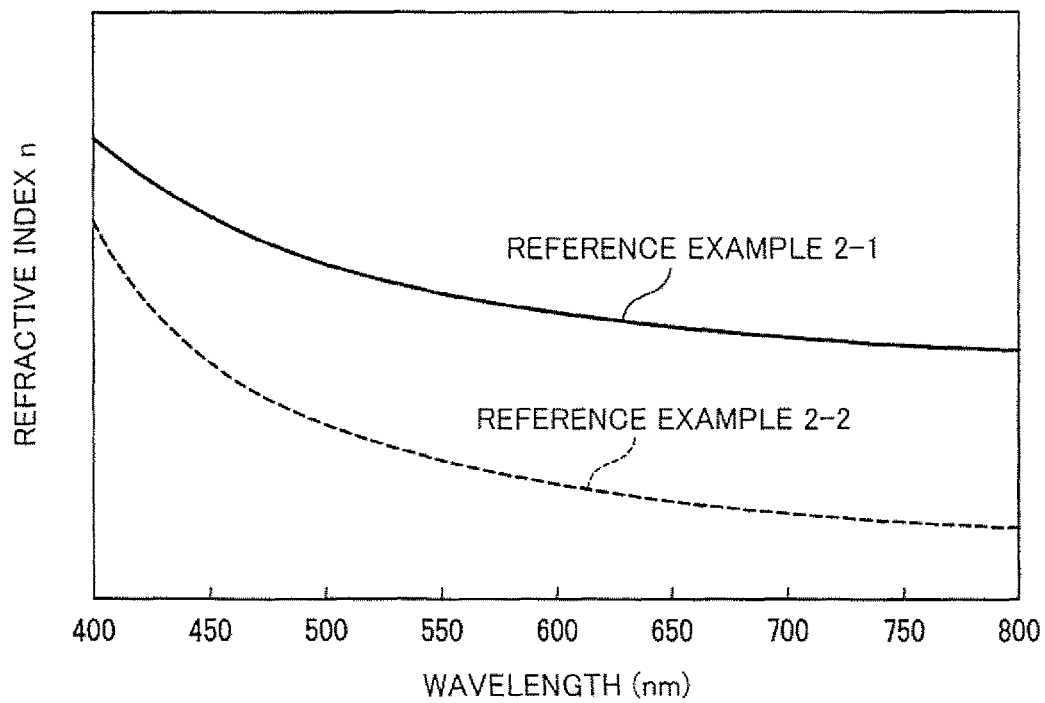
FIG. 10 is a graph illustrating results of measuring the refractive index of a thin film made only of an electron transport material and the refractive index of a thin film containing the electron transport material and a quinolinol complex containing Li in Reference Example 2.
FIG. 11 is a schematic view illustrating an element structure of an organic EL element in Example 1.

As illustrated in FIGS. 9 and 10, such a quinolinol complex has a lower refractive index than a typical electron transport layer material. Generally, the refractive index of an organic layer made by mixing two types of materials is determined by a combined refractive index of both materials depending on a mixing ratio. Accordingly, the refractive index of the electron transport layer 17 can be reduced by mixing the quinolinol complex into the electron transport layer 17. The refractive index of the electron transport layer 17 containing the quinolinol complex can be reduced by about 0.05 to 0.10 from that of the electron transport layer 17 made only of the electron transport material, depending on the content of the quinolinol complex.

Moreover, since the quinolinol complex is a metal complex, the quinolinol complex does not greatly reduce the electron transport property of the electron transport layer 17 even when it is contained in the electron transport layer 17.

Examples of the quinolinol complex containing Li include 8-hydroxyquinolinolato-lithium and the like.

Examples of the quinolinol complex containing Ca include bis(5-chloro-8-quinolinolato)calcium and the like.

Any one type of these quinolinol complexes can be used alone or two or more types can be used in combination.

The content of the quinolinol complex containing Li or Ca in the electron transport layer 17 is preferably 25% by mass or more, more preferably 30% by mass or more, even more preferably, 50% by mass or more.

The quinolinol complex containing Li or Ca in the electron transport layer 17 can reduce the refractive index of the electron transport layer 17 depending on its content as described in [0027] and can greatly reduce the refractive index of the electron transport layer 17 when its content is 25% by mass or more.

When the electron injection layer is to be provided, the electron injection layer is provided between the first electrode 12 and the first electron transport layer 17 or between the hole transport layer 15 and an electron transport layer located on the second electrode 13 side to improve injection efficiency of electrons from the first electrode 12 or the electron transport layer. An electron transport material having properties similar to the electron transport layer is generally used for the electron injection layers. The electron transport layer and the electron injection layer are sometimes collectively referred to as electron transport layer.

When a hole transport layer is to be provided, the hole transport layer is made of, for example, a conventionally well-known hole transport material but is not limited to a particular material. For example, an organic compound (electron donating material) which has an ionization potential less than 5.7 eV and which has a hole transport property, that is an electron donating property is preferably used.

When a hole injection layer is to be provided, the hole injection layer is provided between the second electrode 13 and the hole transport layer 15 to improve injection efficiency of holes from the second electrode 13 or the hole transport layer 15. An electron donating material having properties similar to the hole transport layer 15 is generally used for the hole injection layer. The hole transport layer and the hole injection layer are sometimes collectively referred to as hole transport layer.

For example, a vacuum deposition method, a spin coating method, or the like can be used as a film forming method of the layers forming the light emitting unit 14. Moreover, conventionally well-known materials can be used as the materials forming the aforementioned electron transport layer, the electron injection layer, the hole blocking layer, the hole transport layer, the hole injection layer, and the like.

The organic EL element 10 having the aforementioned structure satisfies a relationship of nETM>nEML>nETL in the light emitting layer 16 in the light emitting unit closest to the first electrode 12, specifically, the light emitting unit 14, where nEML is the refractive index of the light emitting layer 16 at a maximum light emission wavelength ($\lambda_{max}$), nETL is the refractive index of the electron transport layer 17 at the maximum light emission wavelength ($\lambda_{max}$), and nETM is the refractive index of a thin film made only of the electron transport material at the maximum light emission wavelength ($\lambda_{max}$).

Here, the maximum light emission wavelength ($\lambda_{max}$) is a wavelength at which a light emission intensity ($P_{INT}(\lambda)$) taking into consideration the spectral luminous efficiency is maximum. The light emission intensity ($P_{INT}(\lambda)$) taking into consideration the spectral luminous efficiency is calculated from the following formula (1):

$$P_{INT}(\lambda)=P(\lambda)\times V(\lambda) \qquad (1)$$

(where, $P_{INT}(\lambda)$ is the light emission intensity taking into consideration the spectral luminous efficiency, $P(\lambda)$ is a light emission intensity, and $V(\lambda)$ is the spectral luminous efficiency, $P_{INT}(\lambda)$, $P(\lambda)$, and $V(\lambda)$ are all functions of (light emission) wavelength $\lambda$).

The critical angle on an interface between the light emitting layer 16 and the electron transport layer 17 is thus small and the total reflection is likely to occur on the interface between the light emitting layer 16 and the electron transport layer 17. The amount of the light reaching the first electrode 12 (cathode) thereby decreases and a decrease in efficiency due to plasmon loss at the first electrode 12 (cathode) can be reduced. As a result, the extraction efficiency of light generated in the light emitting layer 16 can be improved.

In the embodiment, a method of measuring the refractive index nEML of the light emitting layer 16 and the refractive index nETL of the electron transport layer 17 is not limited to a particular method and a method using a well-known measurement device is employed. For example, a thin film characteristic measurement device (trade name: n&k Analyzer 1700-RT, manufactured by n&k Technology, Inc.) or the like is used as the measurement device.

Moreover, the difference between the refractive index nEML of the light emitting layer 16 and the refractive index nETL of the electron transport layer 17 (nEML−nETL) is preferably 0.01 to 0.10.

The critical angle on the interface between the light emitting layer 16 and the electron transport layer 17 is thus small and the total reflection is likely to occur on the interface between the light emitting layer 16 and the electron transport layer 17. The amount of the light reaching the first electrode 12 (cathode) thereby decreases and, as a result, a decrease in efficiency due to plasmon loss at the first electrode 12 (cathode) can be reduced.

Since the organic EL element 10 of the embodiment has an excellent light extraction efficiency as described above, the organic EL element 10 can be preferably used as, for example, a light source of a lighting device such as general lighting equipment.

Figure 2:
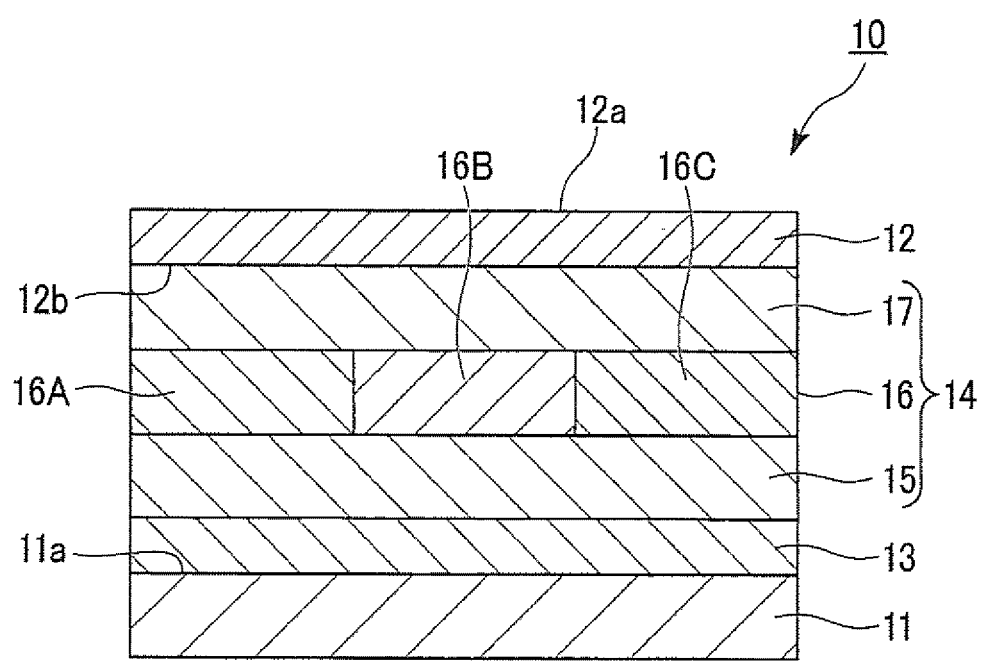
FIG. 2 is a cross-sectional view illustrating another schematic configuration example of the first embodiment of the organic EL element in the present invention.
Figure 3:
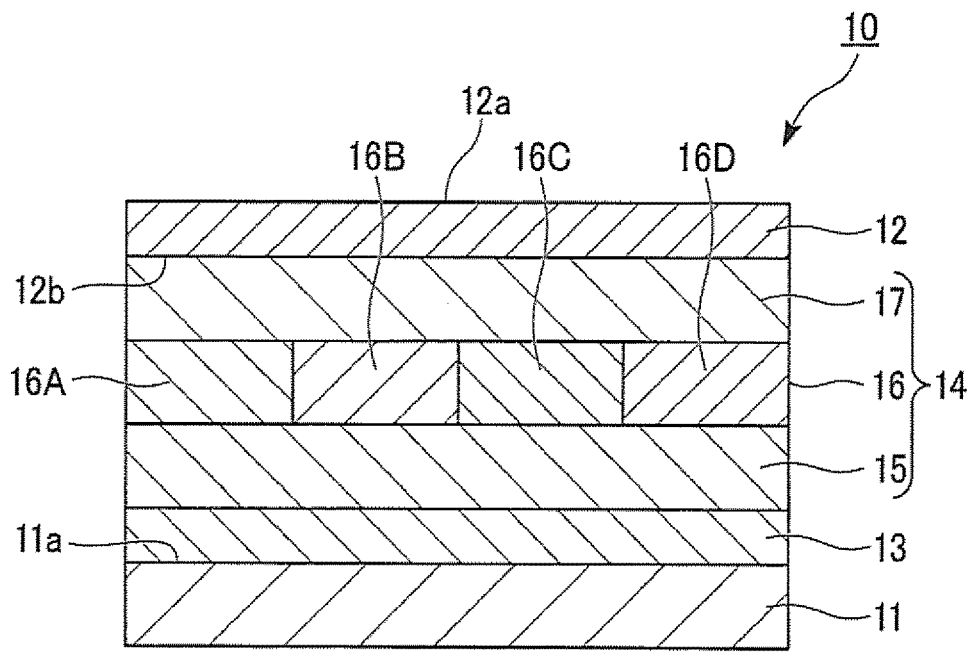
FIG. 3 is a cross-sectional view illustrating yet another schematic configuration example of the first embodiment of the organic EL element in the present invention.

Note that, although the example in which the light emitting layer 16 includes one type of light emitting portion as illustrated in FIG. 1 is described in the embodiment, the embodiment is not limited to this example. As illustrated in FIG. 2, the light emitting layer 16 may include a first light emitting portion 16A which emits red light, a second light emitting portion 16B which emits green light, and a third light emitting portion 16C which emits blue light. Moreover, as illustrated in FIG. 3, the light emitting layer 16 may include the first light emitting portion 16A which emits the red light, the second light emitting portion 16B which emits the green light, the third light emitting portion 16C which emits the blue light, and a fourth light emitting portion 16D which emits white light.

The first light emitting portion 16A to the fourth light emitting portion 16D may be arranged in any order. Moreover, the film thicknesses of the hole transport layer and the electron blocking layer provided for each light emitting portion may vary from those for the other light emitting portions to obtain an appropriate interference effect matching light of each color.

When the light emitting layer 16 includes multiple light emitting portions as described above, a partition wall (illustration omitted) called bank and a partition wall (illustration omitted) called rib which is stacked on the bank are provided between each pair of adjacent light emitting portions to prevent mixing of colors of light emitted by the light emitting layer.

Second Embodiment

Figure 4:
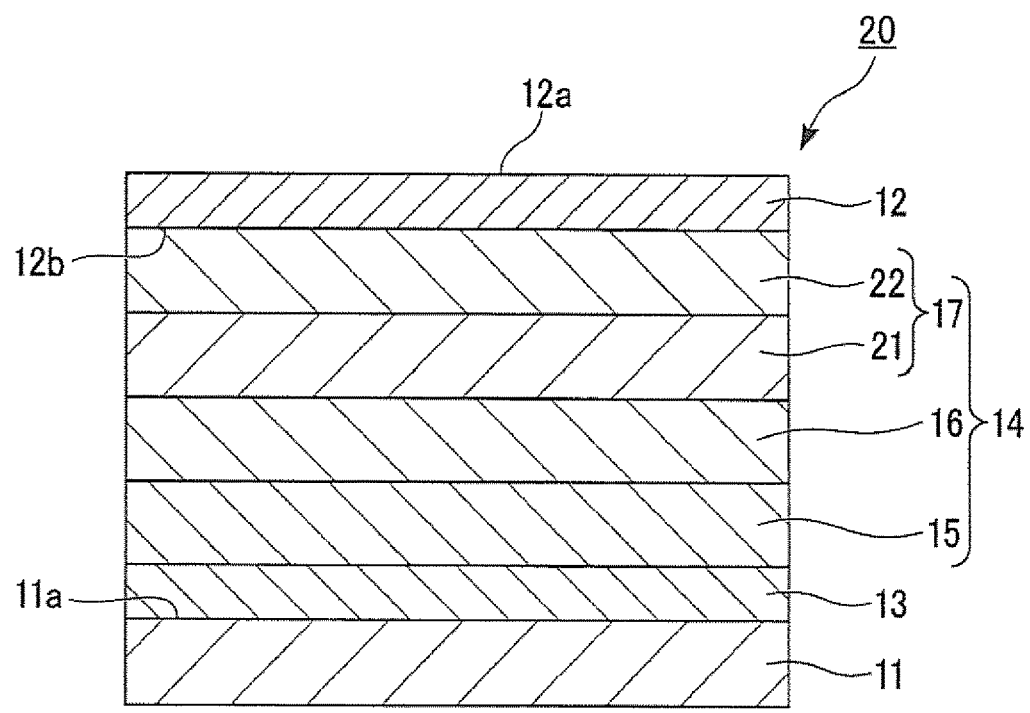
FIG. 4 is a cross-sectional view illustrating a schematic configuration of a second embodiment of the organic EL element in the present invention.

A second embodiment of the organic EL element of the present invention is described. FIG. 4 is a cross-sectional view illustrating a schematic configuration of the second embodiment of the organic EL element in the present invention. In FIG. 4, the same constitutional elements as those in the first embodiment of the organic EL element of the present invention illustrated in FIG. 1 are denoted by the same reference numerals and description thereof is omitted.

As illustrated in FIG. 4, the organic EL element 20 of the embodiment includes the light emitting unit 14 between the first electrode 12 and the second electrode 13 on the one surface 11a of the substrate 11. Specifically, the organic EL element 20 has a laminate structure in which the second electrode 13, the hole transport layer 15, the light emitting layer 16, the electron transport layer 17, and the first electrode 12 are stacked one on top of another in this order on the one surface 11a of the substrate 11.

The light emitting unit 14 is formed of the hole transport layer 15, the light emitting layer 16, and the electron transport layer 17. Moreover, the electron transport layer 17 is formed of a first electron transport layer 21 and a second electron transport layer 22. Furthermore, the light emitting layer 16, the first electron transport layer 21, and the second electron transport layer 22 are stacked one on top of another in this order from the hole transport layer 15 side. In other words, the first electron transport layer 21 is provided adjacent to the light emitting layer 16, on the opposite side thereof to the hole transport layer 15. Moreover, the second electron transport layer 22 is provided adjacent to the first electron transport layer 21, on the opposite side thereof to the light emitting layer 16.

The first electron transport layer 21 and the second electron transport layer 22 have the same configuration as the electron transport layer 17 in the aforementioned first embodiment.

The organic EL element 20 may employ a structure satisfying a relationship of nEML<nETL1 and a relationship of nETL1>nETL2, where nEML is the refractive index of the light emitting layer 16 at the maximum light emission wavelength ($\lambda_{max}$) calculated by the aforementioned formula (1), nETL1 is the refractive index of the first electron transport layer 21 at the maximum light emission wavelength ($\lambda_{max}$), and nETL2 is the refractive index of the second electron transport layer 22 at the maximum light emission wavelength ($\lambda_{max}$). In this case, the refractive index of the first electron transport layer 21 is greater than the refractive index of the light emitting layer 16 and, as a result, no critical angle is formed on an interface between the light emitting layer 16 and the first electron transport layer 21. Hence, no total reflection occurs on the interface between the light emitting layer 16 and the first electron transport layer 21. All the light thus reaches the first electron transport layer 21. Meanwhile, setting the refractive index of the second electron transport layer 22 smaller than the refractive index of the first electron transport layer 21 causes the critical angle on an interface between the first electron transport layer 21 and the second electron transport layer 22 to be smaller and total reflection is likely to occur on the interface between the first electron transport layer 21 and the second electron transport layer 22. The amount of light reaching the first electrode 12 (cathode) thereby decreases and, as a result, a decrease in efficiency due to plasmon loss at the first electrode 12 (cathode) can be reduced. A specific example is given. When an electron transport layer having a function of blocking holes is to be arranged on the first electron transport layer 21 to improve element efficiency, in the structure of the organic EL element 10, a material which has the function of blocking the holes and which has a lower refractive index than that of the light emitting layer 16 needs to be arranged. Accordingly, the range of choice for the material is very narrow. Meanwhile, in the structure of the organic EL element 20, for example, even when an electron transport material which has an excellent hole blocking function but which has a higher refractive index than that of the light emitting layer 16 is used as the first electron transport layer 21, effects similar to those in the structure of the organic EL element 10 can be obtained by using the second electron transport layer 22 which has a lower refractive index than that of the first electron transport layer 21. As a result, the extraction efficiency of light generated in the light emitting layer 16 can be improved.

The difference between the refractive index nEML of the light emitting layer 16 and the refractive index nETL2 of the second electron transport layer 22 (nEML−nETL2) is preferably 0.01 to 0.10.

Since the organic EL element 20 of the embodiment has an excellent light extraction efficiency as described above, the organic EL element 20 can be preferably used as, for example, a light source of a lighting device such as general lighting equipment.

Note that, although the example in which the light emitting layer 16 includes one type of light emitting portion as illustrated in FIG. 4 is described in the embodiment, the embodiment is not limited to this example. Also in this embodiment, as in the first embodiment, the light emitting layer 16 may include the first light emitting portion 16A which emits the red light, the second light emitting portion 16B which emits the green light, and the third light emitting portion 16C which emits the blue light (see FIG. 2). Moreover, the light emitting layer 16 may include the first light emitting portion 16A which emits the red light, the second light emitting portion 16B which emits the green light, the third light emitting portion 16C which emits the blue light, and the fourth light emitting portion 16D which emits the white light (see FIG. 3).

The first light emitting portion 16A to the fourth light emitting portion 16D may be arranged in any order. Moreover, the film thicknesses of the hole transport layer and the electron blocking layer provided for each light emitting portion may vary from those for the other light emitting portions to obtain an appropriate interference effect matching light of each color.

When the light emitting layer 16 includes multiple light emitting portions as described above, a partition wall (illustration omitted) called bank and a partition wall (illustration omitted) called rib which is stacked on the bank are provided between each pair of adjacent light emitting portions to prevent mixing of colors of light emitted by the light emitting layer.

Third Embodiment

Figure 5:
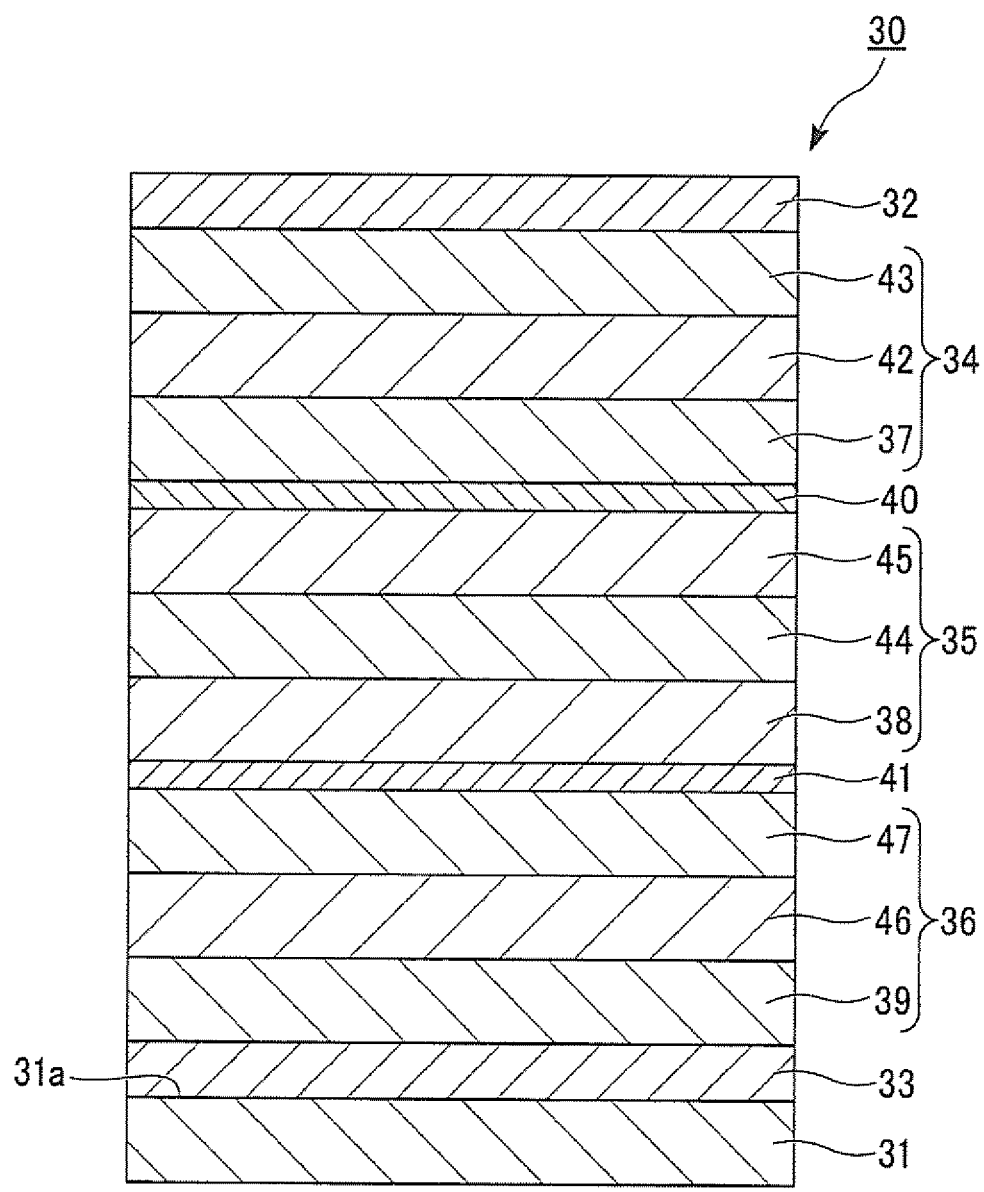
FIG. 5 is a cross-sectional view illustrating a schematic configuration of a third embodiment of the organic EL element in the present invention.

A third embodiment of the organic EL element of the present invention is described. FIG. 5 is a cross-sectional view illustrating a schematic configuration of the third embodiment of the organic EL element in the present invention.

As illustrated in FIG. 5, the organic EL element 30 of the embodiment includes a first light emitting unit 34, a second light emitting unit 35, and a third light emitting unit 36 between a first electrode 32 and a second electrode 33 on one surface 31a of a substrate 31. The organic EL element 30 has a laminate structure in which a first charge generating layer 40 is sandwiched between the first light emitting unit 34 and the second light emitting unit 35 and a second charge generating layer 41 is sandwiched between the second light emitting unit 35 and the third light emitting unit 36. Specifically, the organic EL element 30 has an MPE structure in which the second electrode 33, the third light emitting unit 36, the second charge generating layer 41, the second light emitting unit 35, the first charge generating layer 40, the first light emitting unit 34, and the first electrode 32 are stacked one on top of another in this order.

The first light emitting unit 34 is formed of a light emitting layer 42, an electron transport layer 43, and a hole transport layer 37. Moreover, the hole transport layer 37, the light emitting layer 42, and the electron transport layer 43 are stacked one on top of another in this order from the first charge generating layer 40 side.

The second light emitting unit 35 is formed of a light emitting layer 44, an electron transport layer 45, and a hole transport layer 38. Moreover, the hole transport layer 38, the light emitting layer 44, and the electron transport layer 45 are stacked one on top of another in this order from the second charge generating layer 41 side.

The third light emitting unit 36 is formed of a light emitting layer 46, an electron transport layer 47, and a hole transport layer 39. Moreover, the hole transport layer 39, the light emitting layer 46, and the electron transport layer 47 are stacked one on top of another in this order from the second electrode 33 side.

The same substrate as the substrate 11 in the aforementioned first embodiment is used as the substrate 31.

The same electrode as the first electrode 12 in the aforementioned first embodiment is used as the first electrode 32.

The same electrode as the second electrode 13 in the aforementioned first embodiment is used as the second electrode 33.

Like the light emitting unit 14 in the aforementioned first embodiment, the first light emitting unit 34, the second light emitting unit 35, and the third light emitting unit 36 may employ any of various structures similar to those of conventionally-known organic EL elements and may have any laminated structure as long as they include light emitting layers made of at least an organic compound. For example, an electron transport layer, an electron injection layer, a hole blocking layer, and the like may be arranged on the first electrode 32 side of each of the light emitting layers 42, 44, 46. Moreover, a hole transport layer, a hole injection layer, an electron blocking layer, and the like may be arranged on the second electrode 33 side of each of the light emitting layers 42, 44, 46.

The light emitting layers 42, 44, 46 have the same configuration as the light emitting layer 16 in the aforementioned first embodiment.

The electron transport layers 43, 45, 47 have the same configuration as the electron transport layer 17 in the aforementioned first embodiment.

In the organic EL element 30 of the embodiment, for example, the light emitting layer 42 included in the first light emitting unit 34 is formed of a red phosphorescent light emitting layer, the light emitting layer 44 included in the second light emitting unit 35 is formed of a blue fluorescent light emitting layer, and the light emitting layer 46 included in the third light emitting unit 36 is formed of a green phosphorescent light emitting layer.

Alternatively, for example, the light emitting layer 42 included in the first light emitting unit 34 is formed of the red phosphorescent light emitting layer and the green phosphorescent light emitting layer, the light emitting layer 44 included in the second light emitting unit 35 is formed of the blue fluorescent light emitting layer, and the light emitting layer 46 included in the third light emitting unit 36 is formed of the blue fluorescent light emitting layer. The light emitting layer 42 included in the first light emitting unit 34 may be a light emitting layer formed of a mixed layer of a red phosphorescent material and a green phosphorescent material.

As another alternative, for example, the light emitting layer 42 included in the first light emitting unit 34 is formed of the blue fluorescent light emitting layer, the light emitting layer 44 included in the second light emitting unit 35 is formed of the red phosphorescent light emitting layer and the green phosphorescent light emitting layer, the light emitting layer 46 included in the third light emitting unit 36 is formed of the blue fluorescent light emitting layer. The light emitting layer 44 included in the second light emitting unit 35 may be a light emitting layer formed of the mixed layer of the red phosphorescent material and the green phosphorescent material.

As yet another alternative, for example, the light emitting layer 42 included in the first light emitting unit 34 is formed of the red phosphorescent light emitting layer and the green phosphorescent light emitting layer, the light emitting layer 44 included in the second light emitting unit 35 is formed of the blue fluorescent light emitting layer, and the light emitting layer 46 included in the third light emitting unit 36 is formed of the red phosphorescent light emitting layer and the green phosphorescent light emitting layer. The light emitting layer 42 included in the first light emitting unit 34 and the light emitting layer 46 included in the third light emitting unit 36 may each be a light emitting layer formed of the mixed layer of the red phosphorescent material and the green phosphorescent material.

The first charge generating layer 40 and the second charge generating layer 41 are each formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the first charge generating layer 40 and the second charge generating layer 41 may each be configured such that the charge generating layer is formed of a mixed layer of different materials and one component of the mixed layer forms a charge transfer complex by redox. In this case, when voltage is applied between the first electrode 32 and the second electrode 33, charges in the charge transfer complex move to the first electrode 32 side and the second electrode 33 side. In the organic EL element 30, holes are thereby injected into the second light emitting unit 35 located on the first electrode 32 side of the second charge generating layer 41 and into the first light emitting unit 34 located on the first electrode 32 side of the first charge generating layer 40. Moreover, in the organic EL element 30, electrons are injected into the third light emitting unit 36 located on the second electrode 33 side of the second charge generating layer 41 and into the second light emitting unit 35 located on the second electrode 33 side of the first charge generating layer 40. Light can be thereby simultaneously emitted from the first light emitting unit 34, the second light emitting unit 35, and the third light emitting unit 36 with the same current amount. Accordingly, a current efficiency and an external quantum efficiency equal to the sum of luminous efficiencies of the first light emitting unit 34, the second light emitting unit 35, and the third light emitting unit 36 can be obtained.

The first charge generating layer 40 and the second charge generating layer 41 may each be a laminate of an electron accepting material and an electron donating material. In this case, when voltage is applied between the first electrode 32 and the second electrode 33, charges in the charge transfer complex move to the first electrode 32 side and the second electrode 33 side. In the organic EL element 30, holes are thereby injected into the second light emitting unit 35 located on the first electrode 32 side of the second charge generating layer 41 and into the first light emitting unit 34 located on the first electrode 32 side of the first charge generating layer 40. Moreover, in the organic EL element 30, electrons are injected into the third light emitting unit 36 located on the second electrode 33 side of the second charge generating layer 41 and into the second light emitting unit 35 located on the second electrode 33 side of the first charge generating layer 40. Light can be thereby simultaneously emitted from the first light emitting unit 34, the second light emitting unit 35, and the third light emitting unit 36 with the same current amount. Accordingly, a current efficiency and an external quantum efficiency equal to the sum of luminous efficiencies of the first light emitting unit 34, the second light emitting unit 35, and the third light emitting unit 36 can be obtained.

For example, materials described in Japanese Patent Application Publication No. 2003-272860 are used as materials forming the first charge generating layer 40 and the second charge generating layer 41. Among these, materials described in paragraphs [0019] to [0021] are preferably used. Alternatively, materials described in paragraphs [0023] to [0026] of "International Patent Application Publication No. WO2010/113493" are used as materials forming the first charge generating layer 40 and the second charge generating layer 41. Among these, a strong electron accepting material (HATCN6) described in paragraph [0059] in particular is a material often used in recent years for the first charge generating layer 40 and the second charge generating layer 41.

As the material forming the first charge generating layer 40 and the second charge generating layer 41, a compound having the structure expressed by the following formula (1) is preferable. Note that, when substituent groups represented by R in the structure expressed by the following formula (1) are CN (cyano groups), this compound is HATCN6 described above.

[Chem. 3]

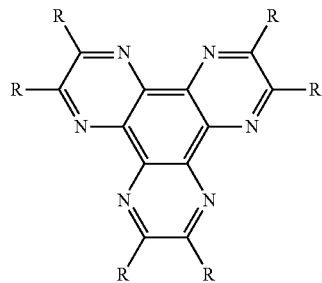

(1)

where R represents an electron withdrawing group of F, Cl, Br, I, CN, or $CF_3$.

The organic EL element 30 having the aforementioned structure can provide white light by causing the first light emitting unit 34, the second light emitting unit 35, and the third light emitting unit 36 to emit light. Moreover, the organic EL element 30 of the embodiment preferably provides white light corresponding to light color of incandescent lamp color (L) or warm white (WW) among chromaticity ranges specified in "JIS Z 9112." Alternatively, the organic EL element 30 preferably provides white light corresponding to any of light colors of daylight (D), neutral white (N), and white (W). Moreover, the organic EL element 30 of the embodiment preferably provides white light with an average color rendering index (Ra) of 70 or more (more preferably 80 or more).

As described above, the organic EL element 30 of the embodiment can achieve an excellent color rendering property while covering a wide color temperature region.

The organic EL element 30 of the embodiment can be thereby preferably used as, for example, light sources of a display device and a lighting device such as general lighting equipment.

Note that, although the example in which each of the electron transport layers 43, 45, 47 forming the first light emitting unit 34, the second light emitting unit 35, and the third light emitting unit 36 is formed of one layer is described in the embodiment, the embodiment is not limited to this example. In the embodiment, each of the electron transport layers 43, 45, 47 may have a two-layer structure as in the second embodiment.

Fourth Embodiment

Figure 6:
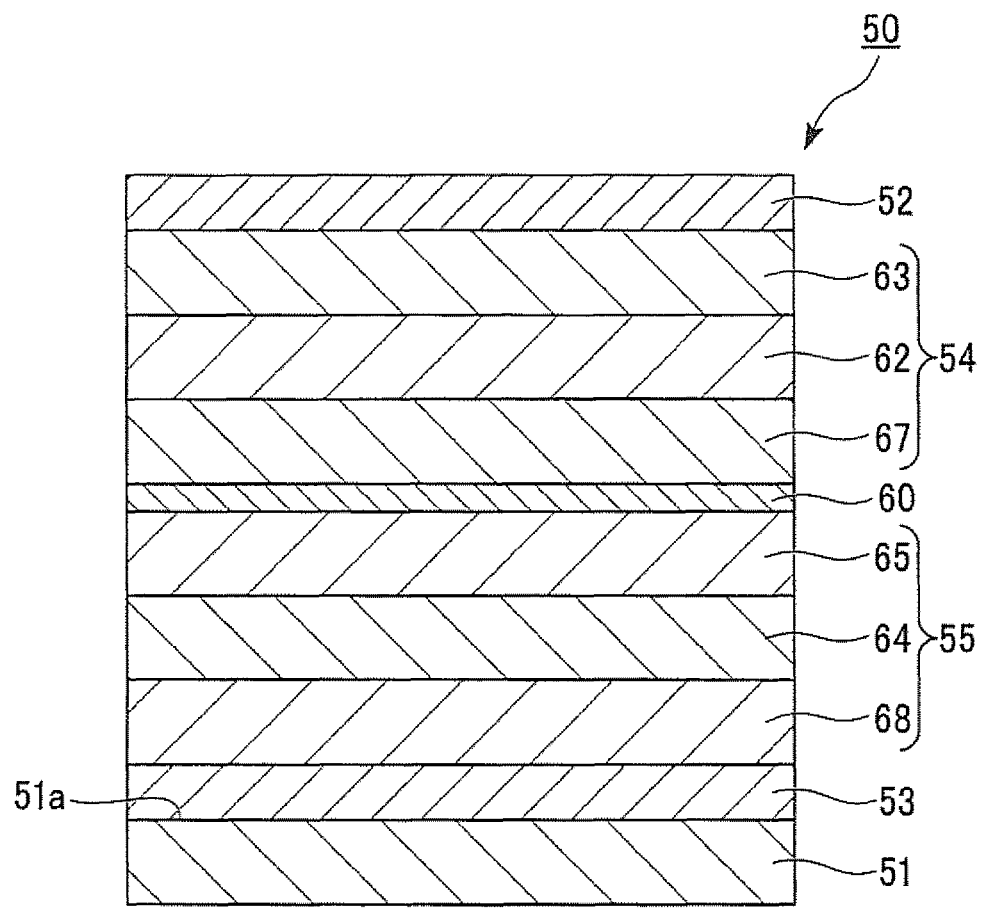
FIG. 6 is a cross-sectional view illustrating a schematic configuration of a fourth embodiment of the organic EL element in the present invention.

A fourth embodiment of the organic EL element of the present invention is described. FIG. 6 is a cross-sectional view illustrating a schematic configuration of the fourth embodiment of the organic EL element in the present invention.

As illustrated in FIG. 6, the organic EL element 50 of the embodiment has a structure which includes a first light emitting unit 54 and a second light emitting unit 55 stacked one on top of the other between a first electrode 52 and a second electrode 53 on one surface 51a of a substrate 51 with a first charge generating layer 60 sandwiched between the first light emitting unit 54 and the second light emitting unit 55. Specifically, the organic EL element 50 has an MPE structure in which the second electrode 53, the second light emitting unit 55, the first charge generating layer 60, the first light emitting unit 54, and the first electrode 52 are stacked one on top of another in this order.

The first light emitting unit 54 is formed of a light emitting layer 62, an electron transport layer 63, and a hole transport layer 67. Moreover, the hole transport layer 67, the light emitting layer 62, and the electron transport layer 63 are stacked one on top of another in this order from the first charge generating layer 60 side.

The second light emitting unit 55 is formed of a light emitting layer 64, an electron transport layer 65, and a hole transport layer 68. Moreover, the hole transport layer 68, the light emitting layer 64, and the electron transport layer 65 are stacked one on top of another in this order from the second electrode 53 side.

The same substrate as the substrate 11 in the aforementioned first embodiment is used as the substrate 51.

The same electrode as the first electrode 12 in the aforementioned first embodiment is used as the first electrode 52.

The same electrode as the second electrode 13 in the aforementioned first embodiment is used as the second electrode 53.

Like the light emitting unit 14 in the aforementioned first embodiment, the first light emitting unit 54 and the second light emitting unit 55 may employ any of various structures similar to those of conventionally-known organic EL elements and may have any laminated structure as long as they include light emitting layers made of at least an organic compound. For example, an electron transport layer, an electron injection layer, a hole blocking layer, and the like may be arranged on the first electrode 52 side of each of the light emitting layers 62, 64. Moreover, a hole transport layer, a hole injection layer, an electron blocking layer, and the like may be arranged on the second electrode 53 side of each of the light emitting layers 62, 64.

The light emitting layers 62, 64 have the same configuration as the light emitting layer 16 in the aforementioned first embodiment.

The electron transport layers 63, 65 have the same configuration as the electron transport layer 17 in the aforementioned first embodiment.

In the organic EL element 50 of the embodiment, for example, the light emitting layer 62 included in the first light emitting unit 54 is formed of a red phosphorescent light emitting layer and a green phosphorescent light emitting layer and the light emitting layer 64 included in the second light emitting unit 55 is formed of a blue fluorescent light emitting layer. The light emitting layer 62 included in the first light emitting unit 54 may be a light emitting layer formed of a mixed layer of a red phosphorescent material and a green phosphorescent material.

Alternatively, for example, the light emitting layer 62 included in the first light emitting unit 54 is formed of the blue fluorescent light emitting layer and the light emitting layer 64 included in the second light emitting unit 55 is formed of the red phosphorescent light emitting layer and the green phosphorescent light emitting layer. The light emitting layer 64 included in the second light emitting unit 55 may be a light emitting layer formed of the mixed layer of the red phosphorescent material and the green phosphorescent material.

The first charge generating layer 60 is formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the first charge generating layer 60 may each be configured such that the charge generating layer is formed of a mixed layer of different materials and one component of the mixed layer forms a charge transfer complex by redox. In this case, when voltage is applied between the first electrode 52 and the second electrode 53, charges in the charge transfer complex move to the first electrode 52 side and the second electrode 53 side. In the organic EL element 50, hole is thereby injected into the first light emitting unit 54 located on the first electrode 52 side of the first charge generating layer 60. Moreover, in the organic EL element 50, electron is injected into the second light emitting unit 55 located on the second electrode 53 side of the first charge generating layer 60. Light can be thereby simultaneously emitted from the first light emitting unit 54 and the second light emitting unit 55 with the same current amount. Accordingly, a current efficiency and an external quantum efficiency proportionate to the sum of luminous efficiencies of the first light emitting unit 54 and the second light emitting unit 55 can be obtained.

Alternatively, the first charge generating layer 60 may be a laminate of an electron accepting material and an electron donating material. In this case, when voltage is applied between the first electrode 52 and the second electrode 53, in an interface between the electron accepting material and the electron donating material, charges generated by reaction involving electron transfer between these electron accepting material and electron donating material move to the first electrode 52 side and the second electrode 53 side. In the organic EL element 50, holes are thereby injected into the first light emitting unit 54 located on the first electrode 52 side of the first charge generating layer 60. Moreover, in the organic EL element 50, electrons are injected into the second light emitting unit 55 located on the second electrode 53 side of the first charge generating layer 60. Light can be thereby simultaneously emitted from the first light emitting unit 54 and the second light emitting unit 55 with the same current amount. Accordingly, a current efficiency and an external quantum efficiency equal to the sum of luminous efficiencies of the first light emitting unit 54 and the second light emitting unit 55 can be obtained.

For example, materials described in Japanese Patent Application Publication No. 2003-272860 are used as materials forming the first charge generating layer 60. Among these, materials described in paragraphs [0019] to [0021] are preferably used. Alternatively, materials described in paragraphs [0023] to [0026] of "International Patent Application Publication No. WO2010/113493" are used as materials forming the first charge generating layer 60. Among these, a strong electron accepting material (HATCN6) described in paragraph [0059] in particular is a material often used in recent years for the first charge generating layer 60.

As the material forming the first charge generating layer 60, a compound having the structure expressed by the following formula (1) is preferable. Note that, when substituent groups represented by R in the structure expressed by the following formula (1) are CN (cyano groups), this compound is HATCN6 described above.

[Chem. 4]

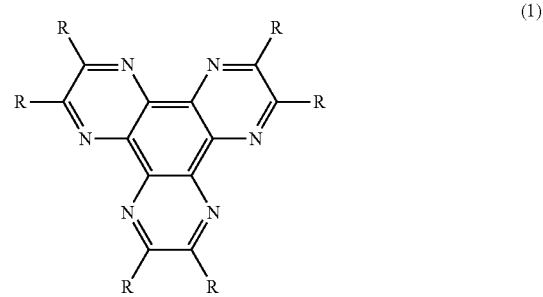

(1)

where R represents an electron withdrawing group of F, Cl, Br, I, CN, or $CF_3$.

The organic EL element 50 having the aforementioned structure can provide white light by causing the first light emitting unit 54 and the second light emitting unit 55 to emit light. Moreover, the organic EL element 50 of the embodiment preferably provides white light corresponding to light color of any of daylight (D), neutral white (N), and white (W) among chromaticity ranges specified in "JIS Z 9112." Furthermore, the organic EL element 50 of the embodiment preferably provides white light with an average color rendering index (Ra) of 70 or more (more preferably 80 or more).

As described above, the organic EL element 50 of the embodiment can achieve an excellent color rendering property while covering a wide color temperature region.

The organic EL element 50 of the embodiment can be thereby preferably used as, for example, light sources of a display device and a lighting device such as general lighting equipment.

Note that, although the example in which each of the electron transport layer 63 forming the first light emitting unit 54 and the electron transport layer 65 forming the second light emitting unit 55 is formed of one layer is described in the embodiment, the embodiment is not limited to this example. In the embodiment, each of the electron transport layers 63, 65 may have a two-layer structure as in the second embodiment.

[Lighting Device]

An embodiment of the lighting device in the present invention is described.

Figure 7:
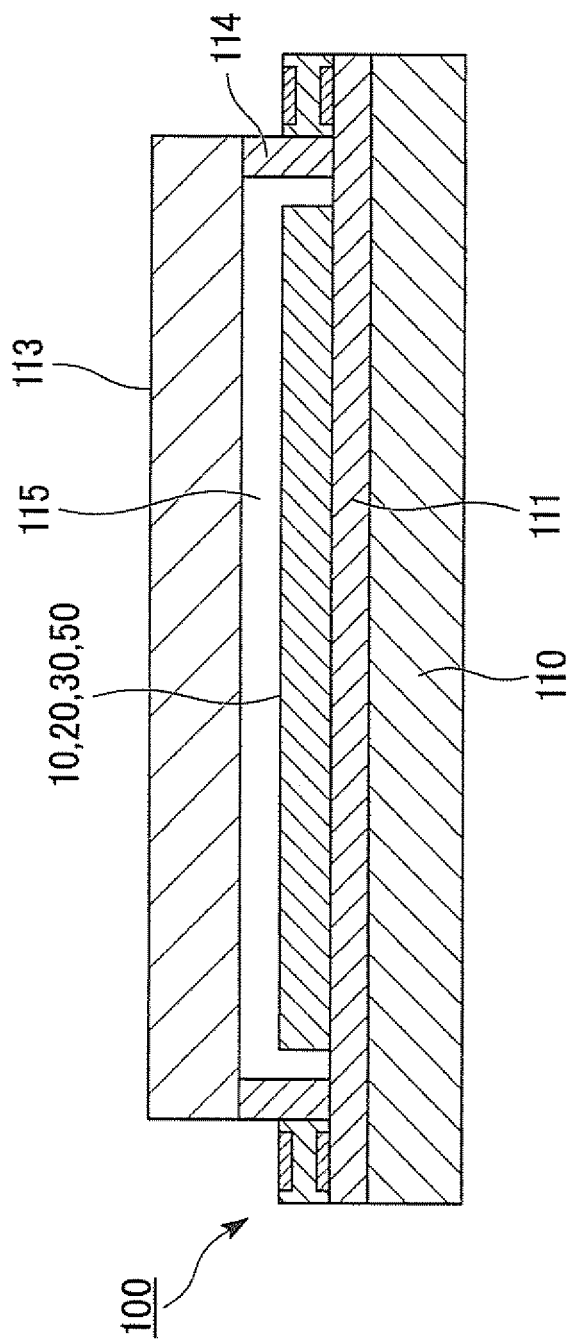
FIG. 7 is a cross-sectional view illustrating a schematic configuration of one embodiment of a lighting device in the present invention.

FIG. 7 is a cross-sectional view illustrating a configuration of the embodiment of the lighting device in the present invention. Although an example of the lighting device to which the present invention is applied is described herein, the lighting device of the present invention is not necessarily limited to such a configuration and various changes can be made as appropriate.

The lighting device 100 of the embodiment includes, for example, any one of the organic EL elements 10, 20, 30, 50 as a light source.

As illustrated in FIG. 7, in the lighting device 100 of the embodiment, multiple anode terminal electrodes 111 and cathode terminal electrodes (illustration omitted) are formed at sides or vertices of a periphery of a glass substrate 110 so that the organic EL element 10, 20, 30, 50 can uniformly emit light. Note that the entire surfaces of the anode terminal electrodes 111 and the entire surfaces of the cathode terminal electrodes are covered with solder (underlying solder) to reduce wiring resistance. Moreover, the anode terminal electrodes 111 and the cathode terminal electrodes uniformly supply an electric current to the organic EL element 10, 20, 30, 50 from the sides or vertices of the periphery of the glass substrate 110. For example, in order to uniformly supply an electric current to the organic EL element 10, 20, 30, 50 formed in a quadrilateral shape, the lighting device 100 includes the anode terminal electrodes 111 on the sides and the cathode terminal electrodes at the vertices. Alternatively, for example, the lighting device 100 includes the anode terminal electrodes 111 on peripheries of L-shaped portions each including a vertex and extending over two sides and the cathode terminal electrodes in center portions of the respective sides.

Moreover, a sealing substrate 113 is arranged on the glass substrate 110 to cover the organic EL element 10, 20, 30, 50 to prevent degrading of the performance of the organic EL element 10, 20, 30, 50 due to oxygen, water, and the like. The sealing substrate 113 is provided on the glass substrate 110 with a peripheral sealing member 114 therebetween. A small gap 115 is provided between the sealing substrate 113 and the organic EL element 10, 20, 30, 50. This gap 115 is filled with a hygroscopic agent. The gap 115 may be filled with, for example, an inert gas such as nitrogen, silicone oil, or the like instead of the hygroscopic agent. Moreover, the gap 115 may be filled with a gel resin in which the hygroscopic agent is dispersed.

Note that, although the glass substrate 110 is used as a base substrate for forming the element in the embodiment, a substrate made of a material such as plastic, metal, or ceramic may also be used. Moreover, in the embodiment, a glass substrate, a plastic substrate, or the like can be used as the sealing substrate 113. When plastic substrates are used as the base substrate and the sealing substrate, the lighting device 100 of the embodiment is flexible.

Moreover, a UV curable resin or a thermal setting resin with low oxygen permeability and low water permeability, a laser glass frit, or the like can be used for the sealing member 114.

The lighting device of the embodiment may have a configuration including an optical film for improving the luminous efficiency, on the light extraction surface side of the organic EL element 10, 20, 30, 50 in the aforementioned embodiment.

The optical film used in the lighting device of the embodiment is provided to improve the luminous efficiency while maintaining the color rendering property.

An organic EL element emits light in a light emitting layer with a higher refractive index (refractive index of about 1.6 to 2.1) than air and it is generally said that only about 15% to 20% of light emitted from the light emitting layer can be extracted. This is because light incident on an interface at an angle equal to or greater than a critical angle is totally reflected and cannot be extracted to the outside of the element. Specifically, light is totally reflected between a transparent substrate and a transparent electrode or the light emitting layer to be guided through the transparent electrode or the light emitting layer and resultantly escapes in directions toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing the substrate with a light condensing property to improve the efficiency (see, for example, "Japanese Patent Application Publication No. Sho 63-314795"); a method of forming reflection surfaces on the side surfaces of the element and the like (see, for example, "Japanese Patent Application Publication No. Hei 1-220394"); a method of introducing a flat layer with an intermediate refractive index between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); a method of forming a diffraction grading between any two of the substrate, the transparent electrode layer, and the light emitting layer (including between the substrate and the outside) (see, for example, "Japanese Patent Application Publication No. Hei 11-283751"); and the like.

Note that, in order to improve the aforementioned color rendering property, the lighting device 100 may have a structure in which a microlens array or the like is further provided on a surface of the aforementioned optical film or may be combined with a light condensing sheet. This allows the light to be condensed in a specific direction, for example, a direction frontward of the element light emitting surface, thereby improving the luminance in the specific direction. Furthermore, a light diffusion film may be used together with the light condensing sheet to control a light emission angle from the organic EL element. For example, a light diffusion film (LIGHT-UP) manufactured by Kimoto Co., Ltd. or the like can be used as the light diffusion film.

Note that the present invention is not necessarily limited to the aforementioned embodiment and various changes can be made within a scope not departing from the spirit of the present invention.

Specifically, in the present invention, any of the organic EL elements 10, 20, 30, 50 capable of providing the aforementioned white light can be preferably used as the light source of the lighting device 100 which is, for example, a general lighting device. Meanwhile, in the present invention, the organic EL elements 10, 20, 30, 50 are not limited for use as the light source of the lighting device 100 and may be used in various applications such as, for example, a backlight of a liquid crystal display.

[Display Device]

An embodiment of the display device in the present invention is described.

Figure 8:
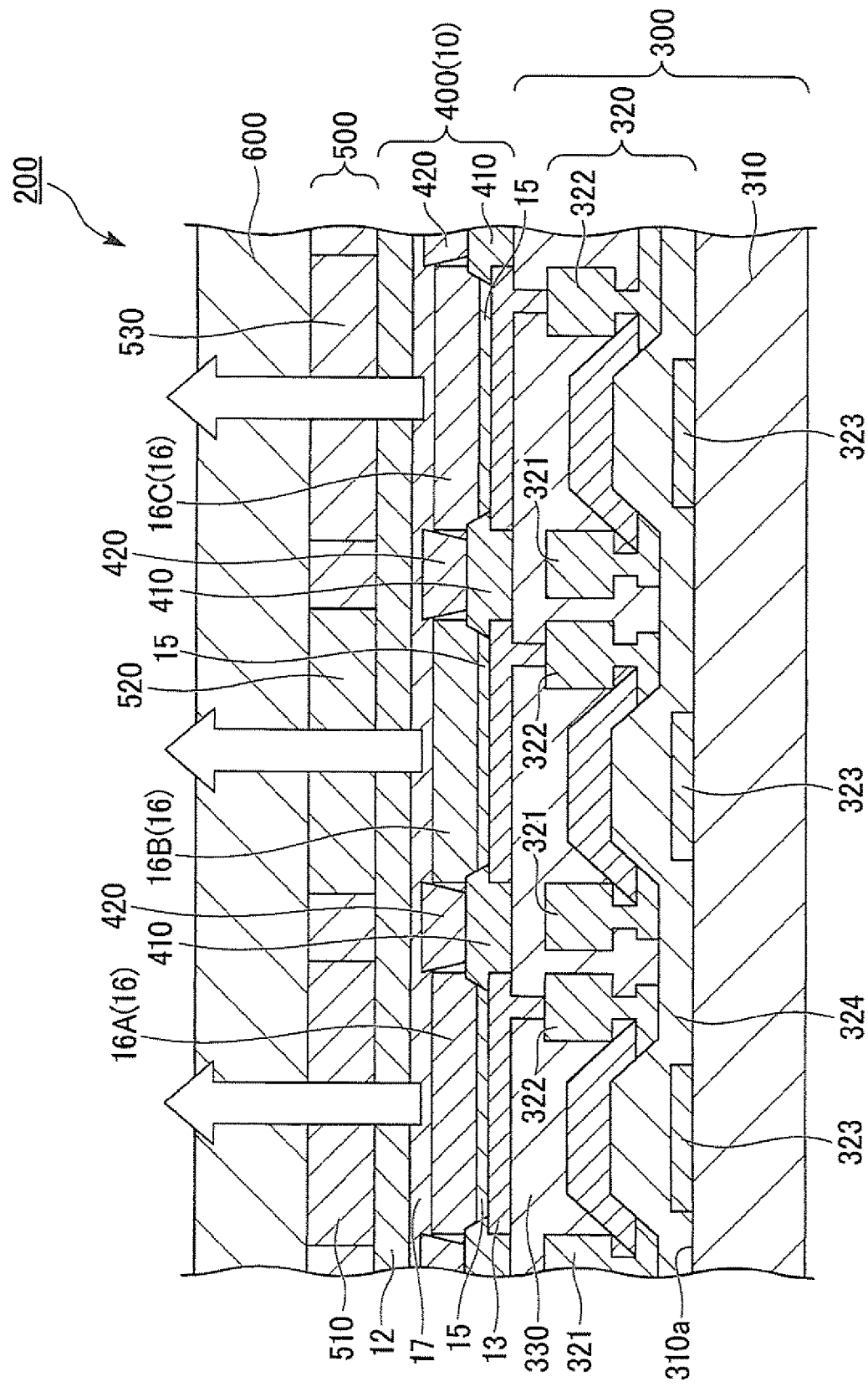
FIG. 8 is a cross-sectional view illustrating a schematic configuration of one embodiment of a display device in the present invention.

FIG. 8 is a cross-sectional view illustrating a configuration of the embodiment of the display device in the present invention. In FIG. 8, the same constitutional elements as those in the first embodiment of the organic EL element in the present invention illustrated in FIG. 1 are denoted by the same reference numerals and description thereof is omitted. Moreover, although an example of the display device to which the present invention is applied is described herein, the display device of the present invention is not necessarily limited to such a configuration and changes can be made as appropriate.

The display device 200 of the embodiment includes, for example, the organic EL element 10 as the light source, the organic EL element 10 having a light emitting layer 16 including a first light emitting portion 16A, a second light emitting portion 16B, and a third light emitting portion 16C as described above.

The display device 200 of the embodiment is a top emission type and is an active matrix type.

As illustrated in FIG. 8, the display device 200 of the embodiment includes a TFT substrate 300, an organic EL element 400, a color filter 500, and a sealing substrate 600. In the display device 200 of the embodiment, the TFT substrate 300, the organic EL element 400, the color filter 500, and the sealing substrate 600 are stacked one on top of another in this order to form a laminated structure.

The TFT substrate 300 includes a base substrate 310, TFT elements 320 which are provided on one surface 310a of the base substrate 310, and an insulating layer 330 which is a planarization film layer (protection layer) provided on the one surface 310a of the base substrate 310 to cover the TFT elements 320.

A glass substrate, a flexible substrate made of plastic, and the like can be given as examples of the base substrate 310.

The TFT elements 320 each include a source electrode 321, a drain electrode 322, a gate electrode 323, a gate insulating layer 324 formed on the gate electrode 323, and a channel region provided on the gate insulating layer 324 and being in contact with the source electrode 321 and the drain electrode 322.

The organic EL element 400 has the same configuration as the organic EL element 10.

The light emitting layer 16 in the organic EL element 400 includes the first light emitting portion 16A which emits red light, the second light emitting portion 16B which emits green light, and the third light emitting portion 16C which emits blue light.

First partition walls (banks) 410 and second partition walls (ribs) 420 stacked thereon are provided between the first light emitting portion 16A and the second light emitting portion 16B, between the second light emitting portion 16B and the third light emitting portion 16C, and between the third light emitting portion 16C and the first light emitting portion 16A.

The first partition walls 410 are provided on the insulating layer 330. The first partition walls 410 have a shape tapered in a direction away from the insulating layer 330. The width of the first partition walls 410 gradually becomes smaller as the distance from the insulating layer 330 increases.

The second partition walls 420 are provided on the first partition walls 410. The second partition walls 420 have a shape reverse-tapered in a direction away from the first partition walls 410. The width of the second partition walls 420 gradually becomes greater as the distance from the first partition walls 410 increases.

The first partition walls 410 and the second partition walls 420 are made of an insulating material. A fluorine-containing resin can be given as an example of the material forming the first partition walls 410 and the second partition walls 420. Vinylidene fluoride, vinyl fluoride, trifluoroethylene, copolymers of these, and the like can be given as examples of a fluorine compound contained in the fluorine-containing resin. A phenol novolac resin, a polyvinyl phenol resin, an acrylic resin, a methacrylic resin, and combination of these can be given as examples of a resin contained in the fluorine-containing resin.

The first light emitting portion 16A, the second light emitting portion 16B, and the third light emitting portion 16C are provided on a second electrode 13 formed on the insulating layer 330 of the TFT elements 320, with a hole transport layer 15 provided between the insulating layer 330 and the light emitting portions 16A, 16B, 16C.

The second electrode 13 is connected to the drain electrodes 322 of the TFT elements 320.

The color filter 500 is provided on a first electrode 12 of the organic EL element 400.

The color filter 500 includes a first color filter 510 corresponding to the first light emitting portion 16A, a second color filter 520 corresponding to the second light emitting portion 16B, and a third color filter 530 corresponding to the third light emitting portion 16C.

The first color filter 510 is a red color filter and is arranged to face the first light emitting portion 16A.

The second color filter 520 is a green color filter and is arranged to face the second light emitting portion 16B.

The third color filter 530 is a blue color filter and is arranged to face the third light emitting portion 16C.

A glass substrate, a flexible substrate made of plastic, and the like can be given as examples of the sealing substrate 600. When plastic is used for the base substrate 310 and the sealing substrate 600, the display device 200 of the embodiment is flexible.

Note that, as illustrated in FIG. 8, although the example in which the light emitting layer 16 of the organic EL element 400 includes the first light emitting portion 16A which emits red light, the second light emitting portion 16B which emits green light, and the third light emitting portion 16C which emits blue light are described in the embodiment, the embodiment is not limited to this. The light emitting layer 16 may include the first light emitting portion 16A which emits red light, the second light emitting portion 16B which emits green light, the third light emitting portion 16C which emits blue light, and a fourth light emitting portion 16D which emits white light. Note that none of the color filters are disposed at a position corresponding to the fourth light emitting portion 16D.

Note that the present invention is not necessarily limited to the aforementioned embodiment and various changes can be made within a scope not departing from the spirit of the present invention.

Specifically, in the present invention, the aforementioned organic EL element 10 capable of providing the white light can be preferably used as, for example, a light source of the display device 200.

EXAMPLES

The present invention is described below more specifically by using Examples and Comparative Examples. However, the present invention is not limited to the following Examples.

Reference Example 1

A thin film of Reference Example 1-1 made of a conventionally well-known electron transport material ETM1 and having a thickness of 40 nm was formed on a glass substrate.

Moreover, a thin film of Reference Example 1-2 made of the conventionally well-known electron transport material and a quinolinol complex containing Li and having a thickness of 40 nm was formed on a glass substrate. Note that the contents of the electron transport material and the quinolinol complex containing Li in this thin film were 50:50 by mass ratio.

The reflectance and the transmittance of each of the thin film of Reference Example 1-1 and the thin film of Reference Example 1-2 were measured by using a thin film characteristic measurement device (trade name: n&k Analyzer 1700-RT, manufactured by n&k Technology, Inc.) and the refractive indices of the thin film of Reference Example 1-1 and the thin film of Reference Example 1-2 were calculated based on the results of the measurement. The results are depicted in FIG. 9. Moreover, an amount by which the refractive index of the thin film of Reference Example 1-2 decreased from the refractive index of the thin film of Reference Example 1-1 is depicted in Table 1.

Reference Example 2

A thin film of Reference Example 2-1 made of a conventionally well-known electron transport material ETM2 and having a thickness of 40 nm was formed on a glass substrate.

Moreover, a thin film of Reference Example 2-2 made of the conventionally well-known electron transport material and a quinolinol complex containing Li and having a thickness of 40 nm was formed on a glass substrate. Note that the contents of the electron transport material and the quinolinol complex containing Li in this thin film were 50:50 by mass ratio.

The refractive indices of the thin film of Reference Example 2-1 and the thin film of Reference Example 2-2 were calculated as in Reference Example 1. The results are depicted in FIG. 10. Moreover, an amount by which the refractive index of the thin film of Reference Example 2-2 decreased from the refractive index of the thin film of Reference Example 2-1 is depicted in Table 1.

TABLE 1

| Wavelength [nm] | Decrease in refractive index n | |
| --- | --- | --- |
| | Reference Example 1-2 | Reference Example 2-2 |
| 400 | 0.08 | 0.05 |
| 500 | 0.09 | 0.10 |
| 600 | 0.09 | 0.10 |
| 700 | 0.09 | 0.10 |
| 800 | 0.09 | 0.11 |
| Average from 400 to 800 | 0.09 | 0.10 |

From the results of FIGS. 9 and 10, it was found that, in the thin film containing the electron transport material and the quinolinol complex containing Li in a mass ratio of 50:50, the refractive index is 0.05 to 0.10 lower than that of the thin film containing no quinolinol complex containing Li.

Example 1

An organic EL element of Example 1 as illustrated in FIG. 11 was manufactured. Specifically, there was manufactured the organic EL element of Example 1 having an element structure including a light emitting unit between a cathode and an anode, the light emitting unit including a hole transport layer, a light emitting layer (EML), and an electron transport layer (ETL).

Specifically, first, there was prepared a soda-lime glass substrate with a thickness of 0.7 mm on which an ITO film with a thickness of 100 nm, a width of 2 mm, and a sheet resistance of about 20Ω/□ was formed. Then, the substrate was subjected to ultrasonic cleaning by using neutral detergent, ion-exchanged water, acetone, and isopropyl alcohol for 5 minutes for each cleaner and then subjected to spin drying and UV/$O_3$ treatment.

Next, vapor deposition crucibles (made of tantalum or alumina) in a vacuum deposition apparatus were filled respectively with materials used to form layers illustrated in FIG. 11. Then, the substrate was set in the vacuum deposition apparatus, electric power was supplied to the vapor deposition crucibles to heat them in a reduced pressure atmosphere with a degree of vacuum of $1 \times 10^{-4}$ Pa or less, and each of the layers was vapor-deposited to a predetermined film thickness at a deposition rate of 0.1 nm per second. Moreover, each of the layers made of two or more materials such as the light emitting layer was formed by supplying power to the corresponding vapor deposition crucibles and performing co-deposition such that the layer was formed to have a predetermined mix ratio. Moreover, the cathode was vapor-deposited to a predetermined film thickness at a deposition rate of 1 nm per second.

A layer containing 50% by mass of the conventionally well-known electron transport material and 50% by mass of the quinolinol complex containing Li was formed as the electron transport layer.

A white light emitting layer was formed as the light emitting layer.

Figure 13:
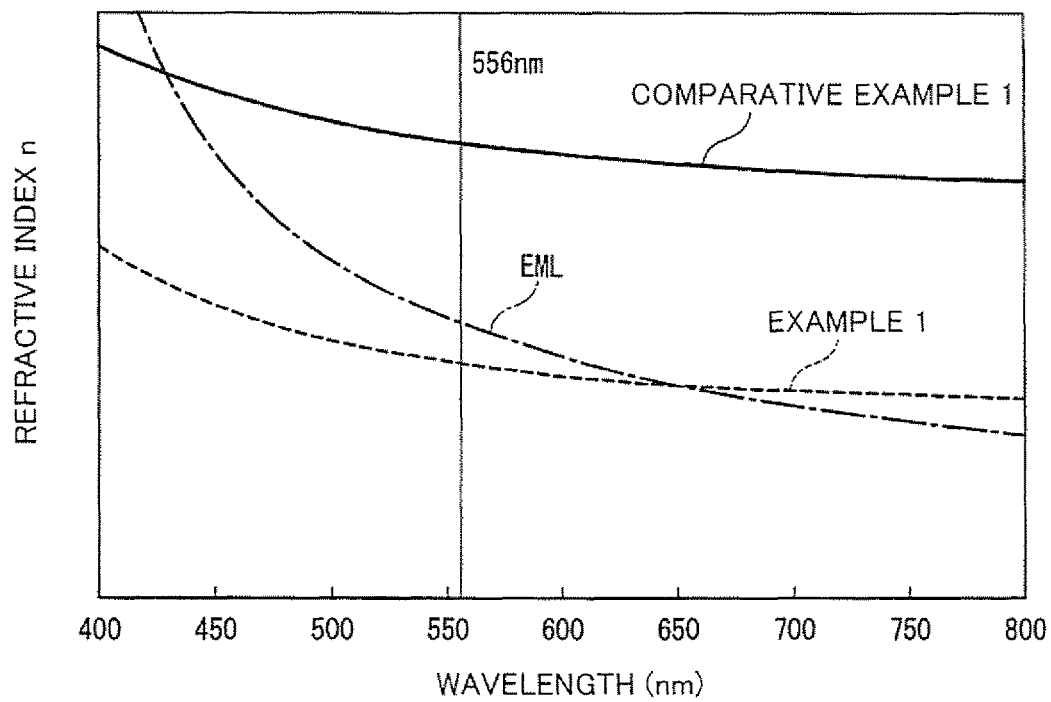
FIG. 13 is a graph illustrating measurement results of the refractive indices of light emitting layers and electron transport layers in the organic EL elements in Example 1 and Comparative Example 1.

Moreover, single-layer thin films each with a thickness of 40 nm which respectively have the same film structures as the light emitting layer and the electron transport layer used in the organic EL element of Example 1 were formed and the reflectance and the transmittance of each of the light emitting layer and the electron transport layer were measured by using the thin film characteristic measurement device (trade name: n&k Analyzer 1700-RT, manufactured by n&k Technology, Inc.). The refractive indices were calculated based on the results of this measurement and the refractive index of the light emitting layer (EML) at the maximum light emission wavelength ($\lambda_{max}$) and the refractive index of the electron transport layer (ETL) at the maximum light emission wavelength ($\lambda_{max}$) were calculated by using the aforementioned formula (1). The results are depicted in FIG. 13.

The organic EL element of Example 1 was connected to a measurement unit driver (trade name: KEITHLEY 2425, manufactured by Keithley Instruments, LLC) and voltage displayed on the measurement unit driver when a predetermined current was supplied was defined as drive voltage (V) of the organic EL element of Example 1. The results are depicted in Table 2.

The organic EL element of Example 1 was connected to the measurement unit driver (trade name: KEITHLEY 2425, manufactured by Keithley Instruments, LLC) and power with a constant current of 3 mA/cm² was supplied to the organic EL element to cause it to emit light in an integrating sphere. Then, the emission spectrum and the luminous flux value (lm) of the organic EL element were measured by using a multichannel spectrometer (trade name: USB2000, manufactured by Ocean Optics, Inc.). Moreover, the luminous flux value was divided by consumed power to calculate the power efficiency (lm/W) of the organic EL element of Example 1. The results are depicted in Table 2 and FIG. 14.

Note that, in Table 2, the power efficiency, the luminous flux value, and the drive voltage of Example 1 are relative values based on the power efficiency, the luminous flux value, and the drive voltage of Comparative Example 1.

Comparative Example 1

Figure 12:
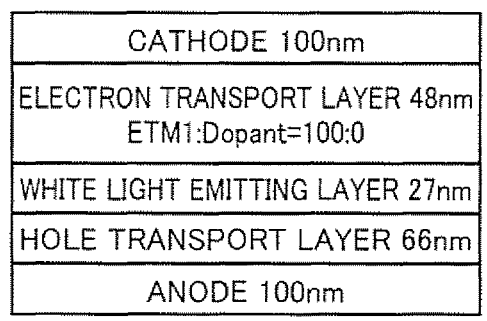
FIG. 12 is a schematic view illustrating an element structure of an organic EL element in Comparative Example 1.

An organic EL element of Comparative Example 1 as illustrated in FIG. 12 was manufactured as in Example 1. Specifically, there was manufactured the organic EL element of Comparative Example 1 having an element structure which included a light emitting unit between a cathode and an anode and in which a hole transport layer was provided between the anode and the light emitting unit, the light emitting unit including a light emitting layer (EML) and an electron transport layer (ETL).

A white light emitting layer was formed as the light emitting layer.

The refractive index was calculated for the organic EL element of Comparative Example 1 as in Example 1. The results are depicted in FIG. 13.

Moreover, the drive voltage, the luminous flux value, and the power efficiency of the organic EL element of Comparative Example 1 were measured as in Example 1. The results are depicted in table 2.

TABLE 2

| | Power efficiency [lm/W] | Luminous flux value [lm] | Drive voltage [V] |
|---|---|---|---|
| Example 1 | 1.14 | 1.17 | 1.03 |
| Comparative Example 1 | 1.00 | 1.00 | 1.00 |

As in Reference Example 1, from the results of FIG. 13, it was found that the refractive index of the electron transport layer containing 50% by mass of the quinolinol complex containing Li in Example 1 was lower than the refractive index of the electron transport layer made only of the conventionally well-known electron transport material in Comparative Example 1 in a wavelength from 400 nm to 800 nm.

From the results of Table 2, it was found that the current efficiency and the power efficiency of the organic EL element of Example 1 were better than those of the organic EL element of Comparative Example 1.

Example 2

Figures 14, 15:
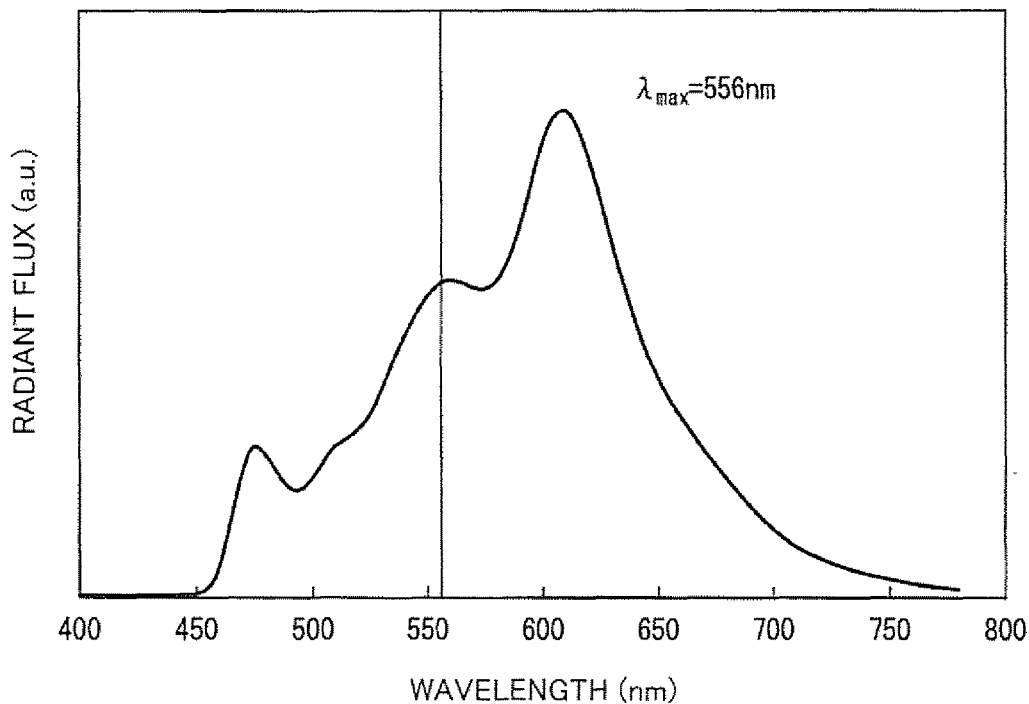
FIG. 14 is a graph illustrating results of measuring the emission spectrum of the organic EL element in Example 1.
FIG. 15 is a schematic view illustrating an element structure of an organic EL element in Example 2.

An organic EL element of Example 2 as illustrated in FIG. 15 was manufactured as in Example 1. Specifically, there was manufactured the organic EL element of Example 2 having an element structure including a light emitting unit between a cathode and an anode, the light emitting unit including a hole transport layer, a light emitting layer (EML), a first electron transport layer (ETL), and a second electron transport layer (ETL).

A layer made only of a conventionally well-known electron transport material was formed as the first electron transport layer.

A layer containing 50% by mass of the conventionally well-known electron transport material and 50% by mass of the quinolinol complex containing Li was formed as the second electron transport layer.

A red light emitting layer was formed as the light emitting layer.

Figure 16:
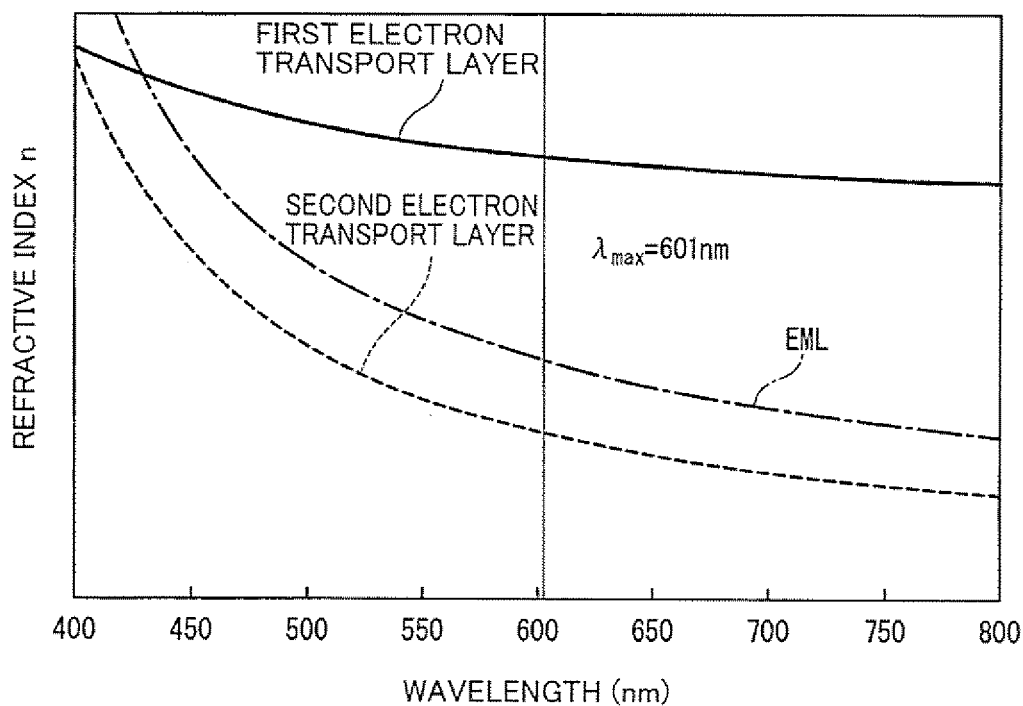
FIG. 16 is a graph illustrating measurement results of the refractive indices of light emitting layers and electron transport layers in the organic EL elements in Example 2 and Comparative Example 2.

As in Example 1, the refractive index of the light emitting layer (EML) at the maximum light emission wavelength ($\lambda_{max}$) and the refractive indices of the first electron transport layer and the second electron transport layer at the maximum light emission wavelength ($\lambda_{max}$) were calculated by using the aforementioned formula (1). The results are depicted in FIG. 16. The organic EL element of Example 2 was connected to the measurement unit driver (trade name: KEITHLEY 2425, manufactured by Keithley Instruments, LLC) and power with a constant current of 3 mA/cm² was supplied to the organic EL element to cause it to emit light in the integrating sphere. Then, the emission spectrum and the luminous flux value of the organic EL element were measured by using the multichannel spectrometer (trade name: USB2000, manufactured by Ocean Optics, Inc.). The results are depicted in Table 3.

Note that, in table 3, the luminous flux values of Example 2 without an optical film, with the optical film, and with a hemispherical lens are relative values based on the luminous flux value of Comparative Example 2 without the optical film.

Comparative Example 2

Figure 17:
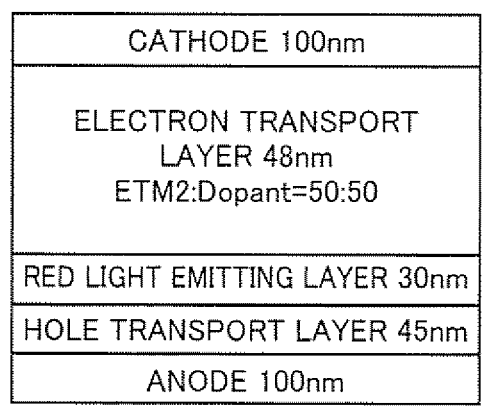
FIG. 17 is a schematic view illustrating an element structure of an organic EL element in Comparative Example 2.

An organic EL element of Comparative Example 2 as illustrated in FIG. 17 was manufactured as in Example 1. Specifically, there was manufactured the organic EL element of Comparative Example 2 having an element structure which included a light emitting unit between a cathode and an anode and in which a hole transport layer was provided between the anode and the light emitting unit, the light emitting unit including a light emitting layer (EML) and an electron transport layer (ETL).

A red light emitting layer was formed as the light emitting layer.

The refractive index was calculated for the organic EL element of Example 2 as in Example 1. The results are depicted in FIG. 16. Moreover, the luminous flux values of the organic EL element of Comparative Example 2 were measured as in Example 2. The results are depicted in Table 3.

TABLE 3

| Luminous flux relative value | Example 2 | Comparative Example 2 |
|---|---|---|
| Without optical film | 1.06 | 1.00 |
| With optical film | 1.49 | 1.41 |
| With hemispherical lens | 1.96 | 1.82 |

From the results of FIG. 16, it was found that the refractive index of the first electron transport layer made only of the electron transport material was higher than the refractive index of the light emitting layer (EML) in a wavelength from 450 nm to 800 nm. Moreover, it was found that the difference in the refractive index between the first electron transport layer made only of the electron transport material and the second electron transport layer containing 50% by mass of the quinolinol complex containing Li was greater than the difference in the refractive index between the light emitting layer (EML) and the second electron transport layer containing 50% by mass of the quinolinol complex containing Li. From the results of Table 3, it was found that the luminous flux values of the organic EL element of Example 2 were better than those of the organic EL element of Comparative Example 2.

Example 3

An organic EL element of Example 3 as illustrated in FIG. 18 was manufactured as in Example 1. Specifically, there was manufactured the organic EL element of Example 3 having an element structure which included: a third light emitting unit including a hole transport layer, a green phosphorescent light emitting layer, and an electron transport layer; a second charge generating layer; a second light emitting unit including a hole transport layer, a blue fluorescent light emitting layer, and an electron transport layer; a first charge generating layer; and a first light emitting unit including a hole transport layer, a red phosphorescent light emitting layer (EML), and an electron transport layer (ETL), between a cathode and an anode.

A layer containing 50% by mass of the conventionally well-known electron transport material and 50% by mass of the quinolinol complex containing Li was formed as the electron transport layer adjacent to the cathode.

As in Example 1, the refractive index of the light emitting layer (EML) at the maximum light emission wavelength ($\lambda_{max}$) and the refractive index of the electron transport layer (ETL) at the maximum light emission wavelength ($\lambda_{max}$) were calculated by using the aforementioned formula (1). The results are depicted in FIG. 19.

The organic EL element of Example 3 was connected to the measurement unit driver (trade name: KEITHLEY 2425, manufactured by Keithley Instruments, LLC) and power with a constant current of 3 mA/cm² was supplied to the organic EL element to cause it to emit light in the integrating sphere. Then, the emission spectrum of the organic EL element was measured by using the multichannel spectrometer (trade name: USB2000, manufactured by Ocean Optics, Inc.). The results are depicted in FIG. 20.

Comparative Example 3

An organic EL element of Comparative Example 3 as illustrated in FIG. 21 was manufactured as in Example 1. Specifically, there was manufactured the organic EL element of Comparative Example 3 having an element structure which included a light emitting unit including: a green phosphorescent light emitting layer; an electron transport layer; a second charge generating layer; a blue fluorescent light emitting layer; an electron transport layer; a first charge generating layer; a red phosphorescent light emitting layer (EML); and an electron transport layer (ETL) and in which a hole transport layer was provided between the anode and the green phosphorescent light emitting layer.

As in Example 1, the refractive index was calculated for the organic EL element of Comparative Example 3. The results are depicted in FIG. 19.

[Evaluation of Organic EL Elements of Example 3 and Comparative Example 3]

The organic EL elements of Example 3 and Comparative Example 3 were each connected to the measurement unit driver (trade name: KEITHLEY 2425, manufactured by Keithley Instruments, LLC) and voltage displayed on the measurement unit driver when a predetermined current was supplied was defined as drive voltage (V) of each of the organic EL elements of Example 3 and Comparative Example 3. The results are depicted in Table 4.

The organic EL elements of Example 3 and Comparative Example 3 were each connected to the measurement unit driver (trade name: KEITHLEY 2425, manufactured by Keithley Instruments, LLC) and power with a constant current of 3 mA/cm² was supplied to the organic EL element to cause it to emit light in the integrating sphere. Then, the emission spectrum and the luminous flux value of each organic EL element were measured by using a multichannel spectrometer (trade name: USB2000, manufactured by Ocean Optics, Inc.). Moreover, the luminous flux value was divided by consumed power to calculate the power efficiency (lm/W) of the organic EL element of Example 3. Then, the deviation duv from the black body locus and the correlated color temperature were derived from the measurement results based on the specifications of "JIS Z 8725." Moreover, the average color rendering index (Ra) of the emitted light color was derived by using the method specified in "JIS Z 8726." The results are depicted in Table 4.

The external quantum efficiencies of the organic EL elements of Example 3 and Comparative Example 3 were measured. The results are depicted in Table 4.

Note that, in Table 4, the drive voltage, the power efficiency, and the external quantum efficiency of Example 3 are relative values based on the drive voltage, the power efficiency, and the external quantum efficiency of Comparative Example 3.

TABLE 4

| | Example 3 | Comparative Example 3 |
|---|---|---|
| Drive voltage (relative value) | 1.03 | 1.00 |
| Power efficiency (relative value) | 1.07 | 1.00 |
| External quantum efficiency (relative value) | 1.13 | 1.00 |
| Deviation duv | −0.001 | 0.003 |
| Average color rendering index (Ra) | 91 | 89 |
| Correlated color temperature (K) | 2,600 | 2,520 |

From the results of FIG. 19, it was found that the refractive index of the electron transport layer containing 50% by mass of the quinolinol complex containing Li in Example 3 was lower than the refractive index of the electron transport layer made only of the conventionally well-known electron transport material in Comparative Example 3 in a wavelength from 400 nm to 800 nm.

From the results of Table 4, it was found that the power efficiency, the external quantum efficiency, and the average color rendering index of the organic EL element of Example 3 were better than those of the organic EL element of Comparative Example 3.

Example 4

An organic EL element of Example 4 as illustrated in FIG. 22 was manufactured as in Example 1. Specifically, there was manufactured the organic EL element of Example 4 having an element structure which included a light emitting unit including: a green phosphorescent light emitting layer; an electron transport layer, a second charge generating layer; a blue fluorescent light emitting layer; an electron transport layer; a first charge generating layer; a red phosphorescent light emitting layer (EML); and an electron transport layer (ETL) between a cathode and an anode and in which a hole transport layer is provided between the anode and the green phosphorescent light emitting layer.

A layer containing 50% by mass of the conventionally well-known electron transport material and 50% by mass of the quinolinol complex containing Li was formed as the electron transport layer adjacent to the cathode.

Moreover, a cathode made of silver (Ag) was formed as a first electrode with a light reflecting property.

As in Example 1, the refractive index of the light emitting layer (EML) at the maximum light emission wavelength ($\lambda_{max}$) and the refractive index of the electron transport layer (ETL) at the maximum light emission wavelength ($\lambda_{max}$) were calculated by using the aforementioned formula (1). The results are depicted in FIG. 23.

The organic EL element of Example 4 was connected to the measurement unit driver (trade name: KEITHLEY 2425, manufactured by Keithley Instruments, LLC) and power with a constant current of 3 mA/cm$^2$ was supplied to the organic EL element to cause it to emit light in the integrating sphere. Then, the emission spectrum of the organic EL element was measured by using the multichannel spectrometer (trade name: USB2000, manufactured by Ocean Optics, Inc.). The results are depicted in FIG. 24.

Comparative Example 4

An organic EL element of Comparative Example 4 as illustrated in FIG. 25 was manufactured as in Example 1. Specifically, there was manufactured the organic EL element of Comparative Example 4 having an element structure which included a light emitting unit including: a green phosphorescent light emitting layer; an electron transport layer; a second charge generating layer; a blue fluorescent light emitting layer; an electron transport layer; a first charge generating layer; a red phosphorescent light emitting layer (EML); and an electron transport layer (ETL) and in which a hole transport layer was provided between the anode and the green phosphorescent light emitting layer.

Moreover, a cathode made of silver (Ag) was formed as a first electrode with a light reflecting property.

As in Example 1, the refractive index was calculated for the organic EL element of Comparative Example 4. The results are depicted in FIG. 23.

[Evaluation of Organic EL Elements of Example 4 and Comparative Example 4]

The organic EL elements of Example 4 and Comparative Example 4 were each connected to the measurement unit driver (trade name: KEITHLEY 2425, manufactured by Keithley Instruments, LLC) and voltage displayed on the measurement unit driver when a predetermined current was supplied was defined as drive voltage (V) of each of the organic EL elements of Example 4 and Comparative Example 4. The results are depicted in Table 5.

The organic EL elements of Example 4 and Comparative Example 4 were each connected to the measurement unit driver (trade name: KEITHLEY 2425, manufactured by Keithley Instruments, LLC) and power with a constant current of 3 mA/cm$^2$ was supplied to the organic EL element to cause it to emit light in the integrating sphere. Then, the emission spectrum and the luminous flux value of each organic EL element were measured by using a multichannel spectrometer (trade name: USB2000, manufactured by Ocean Optics, Inc.). Moreover, the luminous flux value was divided by consumed power to calculate the power efficiency (lm/W) of the organic EL element of Example 4. Then, the deviation duv from the black body locus and the correlated color temperature were derived from the measurement results based on the specifications of "JIS Z 8725." Moreover, the average color rendering index (Ra) of the emitted light color was derived by using the method specified in "JIS Z 8726." The results are depicted in Table 5.

Note that, in Table 5, the drive voltage, the power efficiency, and the external quantum efficiency of Example 4 are relative values based on the drive voltage, the power efficiency, and the external quantum efficiency of Comparative Example 4.

TABLE 5

|  | Example 4 | Comparative Example 4 |
| --- | --- | --- |
| Drive voltage (relative value) | 0.99 | 1.00 |
| Power efficiency (relative value) | 1.11 | 1.00 |
| External quantum efficiency (relative value) | 1.03 | 1.00 |
| Deviation duv | 0.005 | −0.002 |
| Average color rendering index (Ra) | 78 | 81 |
| Correlated color temperature (K) | 3,040 | 2,880 |

From the results of FIG. 23, it was found that the refractive index of the electron transport layer containing 50% by mass of the quinolinol complex containing Li in Example 4 was lower than the refractive index of the electron transport layer made only of the conventionally well-known electron transport material in Comparative Example 4 in a wavelength from 400 nm to 800 nm.

From the results of Table 5, it was found that the power efficiency and the external quantum efficiency of the organic EL element of Example 4 were better than those of the organic EL element of Comparative Example 4.

In the element structures of Example 4 and Comparative Example 4, Ag with high reflectance in a visible light region was used for the first electrode with the light reflecting property and, from the results of Table 5, it was found that the power efficiency and the external quantum efficiency of the organic EL element of Example 4 were better than those of the organic EL element of Comparative Example 4. In other words, it was found that it was possible to obtain an effect of improving the extraction efficiency of light generated in the light emitting layer also when Ag with high reflectance was used for the first electrode.

INDUSTRIAL APPLICABILITY

According to one aspect described above, it is possible to provide an organic electroluminescent element having an improved extraction efficiency of light generated in a light emitting layer and provide a lighting device and a display device including the same.

DESCRIPTION OF REFERENCE NUMERALS 10, 20, 30, 50 organic EL element
11 substrate
12 first electrode
13 second electrode
14 light emitting unit
15 hole transport layer
16 light emitting layer
17 electron transport layer
21 first electron transport layer
22 second electron transport layer
31 substrate
32 first electrode
33 second electrode
34 first light emitting unit
35 second light emitting unit
36 third light emitting unit
37, 38, 39, 67, 68 hole transport layer
40 first charge generating layer
41 second charge generating layer
42, 44, 46, 62, 64 light emitting layer
43, 45, 47, 63, 65 electron transport layer
51 substrate
52 first electrode
53 second electrode
54 first light emitting unit
55 second light emitting unit
60 first charge generating layer
100 lighting device
111 anode terminal electrode
113 sealing substrate
114 sealing member
115 gap
200 display device
300 TFT substrate
310 base substrate
320 TFT element
321 source electrode
322 drain electrode
323 gate electrode
324 gate insulating layer
330 insulating layer
400 organic EL element
410 first partition wall
420 second partition wall
500 color filter
510 first color filter
520 second color filter
530 third color filter
600 sealing substrate

The invention claimed is:

1. An organic electroluminescent element characterized in that
the organic electroluminescent element comprises at least one light emitting unit between a first electrode having a light reflecting property and a second electrode having a light transmitting property, the light emitting unit including an electron transport layer and a light emitting layer made of at least an organic compound, and
in the light emitting layer of the light emitting unit closest to the first electrode, a relationship of nEML>nETL is satisfied, where nEML is a refractive index of the light emitting layer at a maximum light emission wavelength ($\lambda_{max}$) and nETL is a refractive index of the electron transport layer at the maximum light emission wavelength ($\lambda_{max}$), the maximum light emission wavelength ($\lambda_{max}$) being a wavelength at which a light emission intensity ($P_{INT}(\lambda)$) taking into consideration a spectral luminous efficiency calculated by formula (1) is maximum, $$P_{INT}(\lambda) = P(\lambda) \times V(\lambda) \tag{1}$$

(where $P_{INT}(\lambda)$ is the light emission intensity taking into consideration the spectral luminous efficiency, $P(\lambda)$ is a light emission intensity, and $V(\lambda)$ is the spectral luminous efficiency, $P_{INT}(\lambda)$, $P(\lambda)$, and $V(\lambda)$ are all functions of wavelength $\lambda$);
a difference between the refractive index nEML and the refractive index nETL (nEML−nETL) is 0.01 to 0.10;
the electron transport layer contains a quinolinol complex containing lithium or calcium.

2. The organic electroluminescent element according to claim 1, characterized in that the light emitting layer of the light emitting unit closest to the first electrode includes a red light emitting portion, a green light emitting portion, and a blue light emitting portion.

3. The organic electroluminescent element according to claim 1, characterized in that the light emitting layer of the light emitting unit closest to the first electrode includes a red light emitting portion, a green light emitting portion, a blue light emitting portion, and a white light emitting portion.

4. The organic electroluminescent element according to claim 1, characterized in that a content of the quinolinol complex containing lithium or calcium in the electron transport layer is 25% by mass or more.

5. The organic electroluminescent element according to claim 4, characterized in that the content of the quinolinol complex containing lithium or calcium is 50% by mass or more.

6. The organic electroluminescent element according to claim 1, characterized in that
the electron transport layer includes a first electron transport layer provided adjacent to the light emitting layer and a second electron transport layer provided adjacent to the first electron transport layer, opposite to the light emitting layer, and
relationships of nEML<nETL1 and nETL1>nETL2 are satisfied, where nEML is the refractive index of the light emitting layer at the maximum light emission wavelength ($\lambda_{max}$) calculated by formula (1), nETL1 is a refractive index of the first electron transport layer at the maximum light emission wavelength ($\lambda_{max}$), and nETL2 is a refractive index of the second electron transport layer at the maximum light emission wavelength ($\lambda_{max}$).

7. The organic electroluminescent element according to claim 1, characterized in that the organic electroluminescent element comprises a plurality of the light emitting units and has a structure in which the plurality of light emitting units are stacked one on top of another with a charge generating layer sandwiched between each pair of the adjacent light emitting units.

8. The organic electroluminescent element according to claim 7, the organic electroluminescent element capable of providing white light by causing the plurality of light emitting units to emit light, characterized in that
the organic electroluminescent element comprises:
a first light emitting unit;
a second light emitting unit; and
a third light emitting unit,
the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, the organic electroluminescent element has a structure in which the second electrode, the third light emitting unit, the second charge generating layer, the second light emitting unit, the first charge generating layer, the first light emitting unit, and the first electrode are stacked one on top of another in this order, the first light emitting unit is any one of a unit which emits red phosphorescent light, a unit which emits the red phosphorescent light and green phosphorescent light, and a unit which emits blue fluorescent light, when the first light emitting unit is the unit which emits the red phosphorescent light, the second light emitting unit is a unit which emits the blue fluorescent light and the third light emitting unit is a unit which emits the green phosphorescent light, when the first light emitting unit is the unit which emits the red phosphorescent light and the green phosphorescent light, the second light emitting unit is a unit which emits the blue fluorescent light and the third light emitting unit is a unit which emits the blue fluorescent light or a unit which emits the red phosphorescent light and the green phosphorescent light, when the first light emitting unit is the unit which emits the blue fluorescent light, the second light emitting unit is a unit which emits the red phosphorescent light and the green phosphorescent light and the third light emitting unit is a unit which emits the blue fluorescent light.

9. The organic electroluminescent element according to claim 8, characterized in that the first charge generating layer and the second charge generating layer are formed of electrically insulating layers made of an electron accepting material and an electron donating material, and a specific resistance of the electrically insulating layers is $1.0 \times 10^2$ Ω·m or more.

10. The organic electroluminescent element according to claim 9, characterized in that the specific resistance of the electrically insulating layers is $1.0 \times 10^5$ Ω·m or more.

11. The organic electroluminescent element according to claim 8, characterized in that each of the first charge generating layer and the second charge generating layer is formed of a mixed layer of different materials and one component of the mixed layer forms a charge transfer complex by redox, and when voltage is applied between the first electrode and the second electrode, charges in the charge transfer complex move toward the first electrode and the second electrode to cause holes to be injected into the second light emitting unit located on the first electrode side of the second charge generating layer and into the first light emitting unit located on the first electrode side of the first charge generating layer and cause electrons to be injected into the third light emitting unit located on the second electrode side of the second charge generating layer and into the second light emitting unit located on the second electrode side of the first charge generating layer.

12. The organic electroluminescent element according to claim 8, characterized in that each of the first charge generating layer and the second charge generating layer is formed of a laminate of an electron accepting material and an electron donating material, and when voltage is applied between the first electrode and the second electrode, in an interface between the electron accepting material and the electron donating material, charges generated by reaction involving electron transfer between the electron accepting material and the electron donating material move toward the first electrode and the second electrode to cause holes to be injected into the second light emitting unit located on the first electrode side of the second charge generating layer and into the first light emitting unit located on the first electrode side of the first charge generating layer and cause electrons to be injected into the third light emitting unit located on the second electrode side of the second charge generating layer and into the second light emitting unit located on the second electrode side of the first charge generating layer.

13. The organic electroluminescent element according to claim 8, characterized in that the first charge generating layer or the second charge generating layer contains a compound having a structure expressed by formula (1):

[Chem. 1]

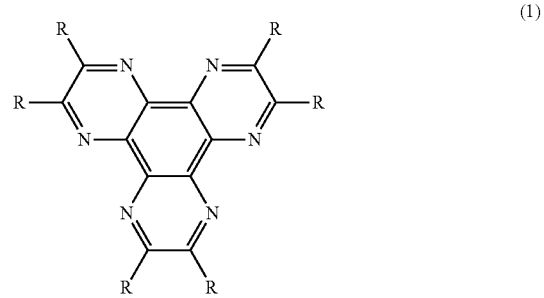

(1)

where R represents an electron withdrawing group of F, Cl, Br, I, CN, or $CF_3$.

14. The organic electroluminescent element according to claim 7, the organic electroluminescent element capable of providing white light by causing the plurality of light emitting units to emit light, characterized in that the organic electroluminescent element comprises:

a first light emitting unit; and a second light emitting unit, the first light emitting unit and the second light emitting unit are stacked one on top of the other with a first charge generating layer sandwiched therebetween, the organic electroluminescent element has a structure in which the second electrode, the second light emitting unit, the first charge generating layer, the first light emitting unit, and the first electrode are stacked one on top of another in this order, the first light emitting unit is a unit which emits red phosphorescent light and green phosphorescent light or a unit which emits blue fluorescent light, when the first light emitting unit is the unit which emits the red phosphorescent light and the green phosphorescent light, the second light emitting unit is a unit which emits the blue fluorescent light, and when the first light emitting unit is the unit which emits the blue fluorescent light, the second light emitting unit is a unit which emits the red phosphorescent light and the green phosphorescent light.

15. The organic electroluminescent element according to claim 14, characterized in that the first charge generating layer is formed of an electrically insulating layer made of an electron accepting material and an electron donating material, and a specific resistance of the electrically insulating layer is $1.0 \times 10^2$ Ω·m or more.

16. The organic electroluminescent element according to claim 15, characterized in that the specific resistance of the electrically insulating layer is $1.0 \times 10^5$ Ω·m or more.

17. The organic electroluminescent element according to claim 14, characterized in that the first charge generating layer is formed of a mixed layer of different materials, one component of the mixed layer is a metal oxide, and the metal oxide forms a charge transfer complex by redox, and when voltage is applied between the first electrode and the second electrode, charges in the charge transfer complex move toward the first electrode to cause holes to be injected into the first light emitting unit located on the first electrode side of the first charge generating layer and cause electrons to be injected into the second light emitting unit located on the second electrode side of the first charge generating layer.

18. The organic electroluminescent element according to claim 14, characterized in that the first charge generating layer is formed of a laminate of an electron accepting material and an electron donating material, and when voltage is applied between the first electrode and the second electrode, in an interface between the electron accepting material and the electron donating material, charges generated by reaction involving electron transfer between the electron accepting material and the electron donating material move toward the first electrode and the second electrode to cause holes to be injected into the first light emitting unit located on the first electrode side of the first charge generating layer and cause electrons to be injected into the second light emitting unit located on the second electrode side of the first charge generating layer.

19. The organic electroluminescent element according to claim 14, characterized in that the first charge generating layer contains a compound having a structure expressed by formula (1):

[Chem. 2]

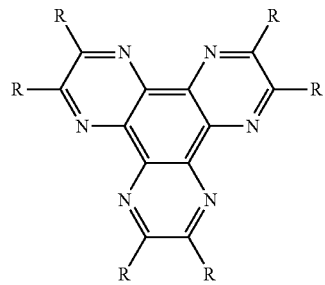

(1)

where R represents an electron withdrawing group of F, Cl, Br, I, CN, or $CF_3$.

20. The organic electroluminescent element according to claim 1, characterized in that the first electrode is made of silver.

21. A lighting device characterized in that the lighting device comprises the organic electroluminescent element according to claim 1.

22. The lighting device according to claim 21, characterized in that the lighting device comprises a base substrate and a sealing substrate which are formed of flexible substrates, and the lighting device is flexible.

23. A display device characterized in that the display device comprises the organic electroluminescent element according to claim 1.

24. The display device according to claim 23, characterized in that the display device comprises a base substrate and a sealing substrate which are formed of flexible substrates, and the display device is flexible.

25. The organic electroluminescent element according to claim 1, characterized in that the electron transport layer comprises a mixture of an electron transport material and the quinolinol complex containing lithium or calcium, and a relationship of nETM>nEML>nETL is satisfied, where nETM is a refractive index of a film consisting only of the electron transport material at the maximum light emission wavelength ($\lambda_{max}$) and as a reference refractive index.

26. The organic electroluminescent element according to claim 25, characterized in that the electron transport material is with a highest occupied molecular orbital (HOMO) level of at least 6.0 eV, and a difference between the reference refractive index nETM and the refractive index nETL (nETM−nETL) is 0.05 to 0.10.

* * * * *